(12) United States Patent
Ho et al.

(10) Patent No.: US 12,166,127 B1
(45) Date of Patent: Dec. 10, 2024

(54) SEMICONDUCTOR DEVICE AND METHOD OF FORMING SAME

(71) Applicant: Taiwan Semiconductor Manufacturing Co., Ltd., Hsinchu (TW)

(72) Inventors: Yi Chen Ho, Taiching (TW); Yiting Chang, Taoyuan (TW); Lun-Kuang Tan, Hsinchu (TW); Chien Lin, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 18/230,419

(22) Filed: Aug. 4, 2023

Related U.S. Application Data

(62) Division of application No. 17/232,309, filed on Apr. 16, 2021, now Pat. No. 11,855,092.

(51) Int. Cl.
| | | |
|---|---|---|
| H01L 29/78 | (2006.01) | |
| H01L 27/092 | (2006.01) | |
| H01L 29/66 | (2006.01) | |

(52) U.S. Cl.
CPC ...... H01L 29/7851 (2013.01); H01L 27/0924 (2013.01); H01L 29/66545 (2013.01); H01L 29/66795 (2013.01)

(58) Field of Classification Search
CPC ........... H01L 29/7851; H01L 29/66545; H01L 29/66795; H01L 27/0924
See application file for complete search history.

(56) References Cited

U.S. PATENT DOCUMENTS

| | | |
|---|---|---|
| 8,962,400 B2 | 2/2015 | Tsai et al. |
| 9,093,514 B2 | 7/2015 | Tsai et al. |
| 9,236,267 B2 | 1/2016 | De et al. |
| 9,245,805 B2 | 1/2016 | Yeh et al. |
| 9,418,897 B1 | 8/2016 | Ching et al. |
| 9,520,482 B1 | 12/2016 | Chang et al. |
| 9,576,814 B2 | 2/2017 | Wu et al. |
| 9,608,116 B2 | 3/2017 | Ching et al. |
| 9,812,363 B1 | 11/2017 | Liao et al. |
| 9,859,380 B2 | 1/2018 | Lee et al. |
| 2010/0323531 A1 | 12/2010 | Honda et al. |
| 2017/0062613 A1 | 3/2017 | Sung et al. |
| 2019/0067027 A1 | 2/2019 | Wang et al. |
| 2020/0135580 A1* | 4/2020 | Hsieh .................. H01L 27/0886 |

* cited by examiner

*Primary Examiner* — Christine A Enad
(74) *Attorney, Agent, or Firm* — Slater Matsil, LLP

(57) ABSTRACT

In an embodiment, a method includes forming a plurality of semiconductor fins over a substrate, the plurality of semiconductor fins comprising a first fin, a second fin, a third fin, and a fourth fin; forming a first dielectric layer over the plurality of semiconductor fins, the first dielectric layer filling an entirety of a first trench between the first fin and the second fin; forming a second dielectric layer over the first dielectric layer, the second dielectric layer filling an entirety of a second trench between the second fin and the third fin, the forming the second dielectric layer comprising: forming an oxynitride layer; and forming an oxide layer; and forming a third dielectric layer over the second dielectric layer, the third dielectric layer filling an entirety of a third trench between the third fin and the fourth fin.

20 Claims, 42 Drawing Sheets

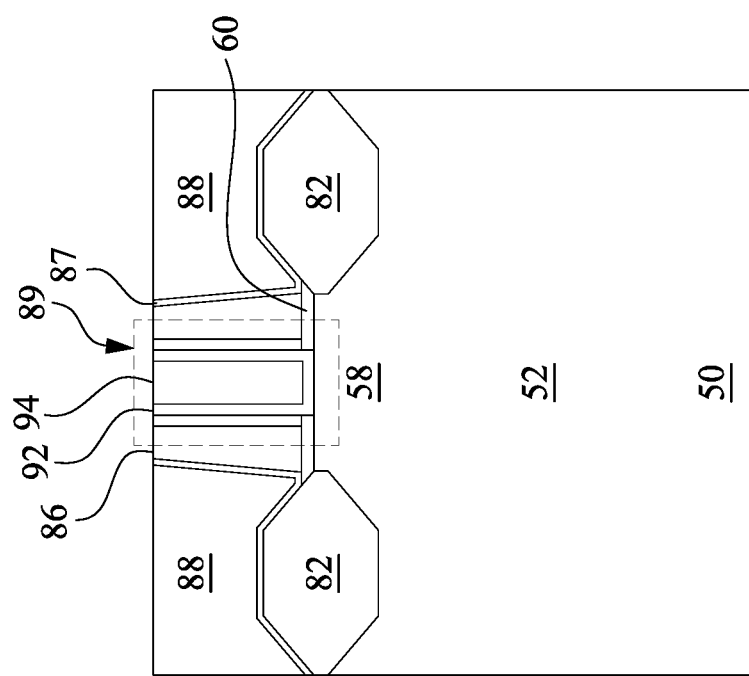

SEMICONDUCTOR DEVICE AND METHOD OF FORMING SAME

PRIORITY CLAIM AND CROSS-REFERENCE

This application is a divisional of U.S. patent application Ser. No. 17/232,309, filed on Apr. 16, 2021, entitled "Semiconductor Device and Methods of Forming Same," which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2, 3, 4, 5, 6, 7, 8, 9, 10, 11, 12, 13, 14, 15, 16, 17, 18, 19, 20A, 20B, 21A, 21B, 22A, 22B, 22C, 22D, 23A, 23B, 24A, 24B, 25A, 25B, 26A, 26B, 26C, 27A, 27B, 28A, 28B, 29A, 29B, 29C, and 29D are cross-sectional views of intermediate stages in the manufacturing of FinFETs, in accordance with some embodiments.

DETAILED DESCRIPTION

Figure 1:
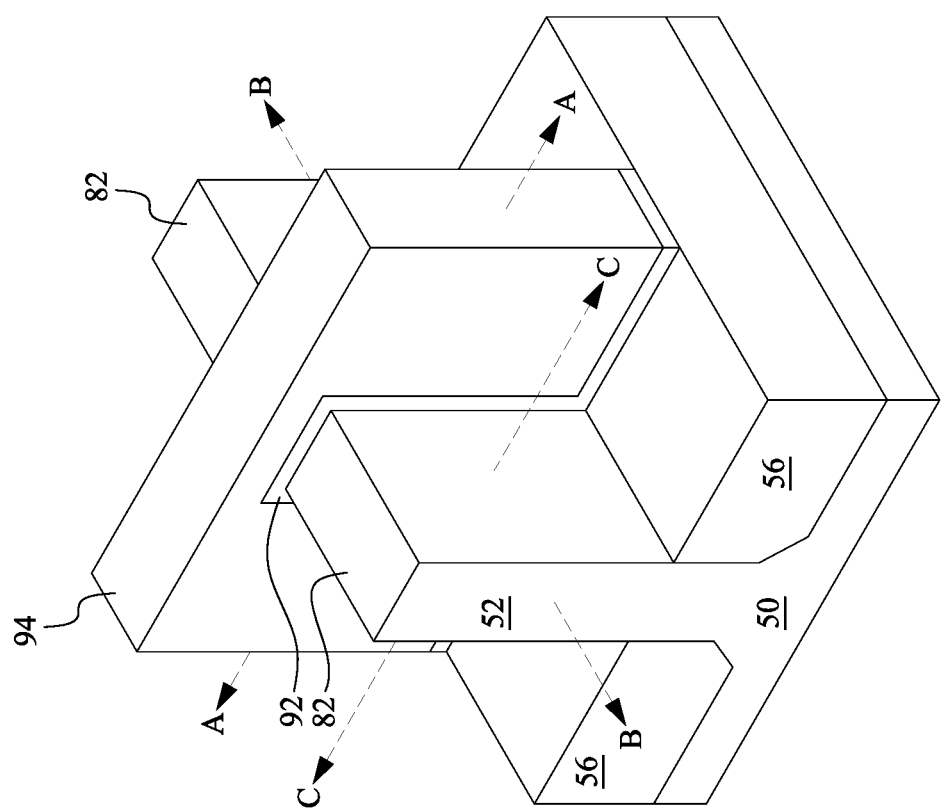
FIG. 1 illustrates an example of a FinFET in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments provide methods for forming a die comprising fin field-effect transistors (FinFETs). The methods include forming semiconductor fins over a substrate and forming varying types of isolation regions and dummy fins between the semiconductor fins. Each of the isolation regions and dummy fins comprises a plurality of dielectric layers. The particular order and formation of the plurality of dielectric layers prevents or reduces the bending of the semiconductor fins and/or strain within the semiconductor fins that may otherwise result from certain ones of the plurality of dielectric layers. Gate structures may then be formed over the semiconductor fins to form transistor structures.

FIG. 1 illustrates an example of a FinFET in a three-dimensional view, in accordance with some embodiments. The FinFET comprises a fin 52 on a substrate 50 (e.g., a semiconductor substrate). Isolation regions 56 are disposed in the substrate 50, and the fin 52 protrudes above and from between neighboring isolation regions 56. Although the isolation regions 56 are described/illustrated as being separate from the substrate 50, as used herein the term "substrate" may be used to refer to just the semiconductor substrate or a semiconductor substrate inclusive of isolation regions. Additionally, although the fin 52 is illustrated as a single, continuous material as the substrate 50, the fin 52 and/or the substrate 50 may comprise a single material or a plurality of materials. In this context, the fin 52 refers to the portion extending between the neighboring isolation regions 56.

A gate dielectric layer 92 is along sidewalls and over a top surface of the fin 52, and a gate electrode 94 is over the gate dielectric layer 92. Source/drain regions 82 are disposed in opposite sides of the fin 52 with respect to the gate dielectric layer 92 and gate electrode 94. FIG. 1 further illustrates reference cross-sections that are used in later figures. Cross-section A-A is along a longitudinal axis of the gate electrode 94 and in a direction, for example, perpendicular to the direction of current flow between the source/drain regions 82 of the FinFET. Cross-section B-B is perpendicular to cross-section A-A and is along a longitudinal axis of the fin 52 and in a direction of, for example, a current flow between the source/drain regions 82 of the FinFET. Cross-section C-C is parallel to cross-section A-A and extends through a source/drain region of the FinFET. Subsequent figures refer to these reference cross-sections for clarity.

Some embodiments discussed herein are discussed in the context of FinFETs formed using a gate-last process. In other embodiments, a gate-first process may be used. Also, some embodiments contemplate aspects used in planar devices, such as planar FETs, nanostructure (e.g., nanosheet, nanowire, gate-all-around, or the like) field effect transistors (NSFETs), or the like.

FIGS. 2 through 29D are cross-sectional views of intermediate stages in the manufacturing of FinFETs, in accordance with some embodiments. FIGS. 2 through 19 illustrate reference cross-section A-A illustrated in FIG. 1, except for multiple fins/FinFETs. FIGS. 20A, 21A, 22A, 23A, 24A, 25A, 26A, 27A, 28A, 29A, 29B, 29C, and 29D are illustrated along reference cross-section A-A illustrated in FIG.

1, and FIGS. 20B, 21B, 22B, 23B, 24B, 25B, 26B, 26C, 27B, and 28B are illustrated along a similar cross-section B-B illustrated in FIG. 1, except for multiple fins/FinFETs. FIGS. 22C and 22D are illustrated along reference cross-section C-C illustrated in FIG. 1, except for multiple fins/FinFETs.

Figure 2:
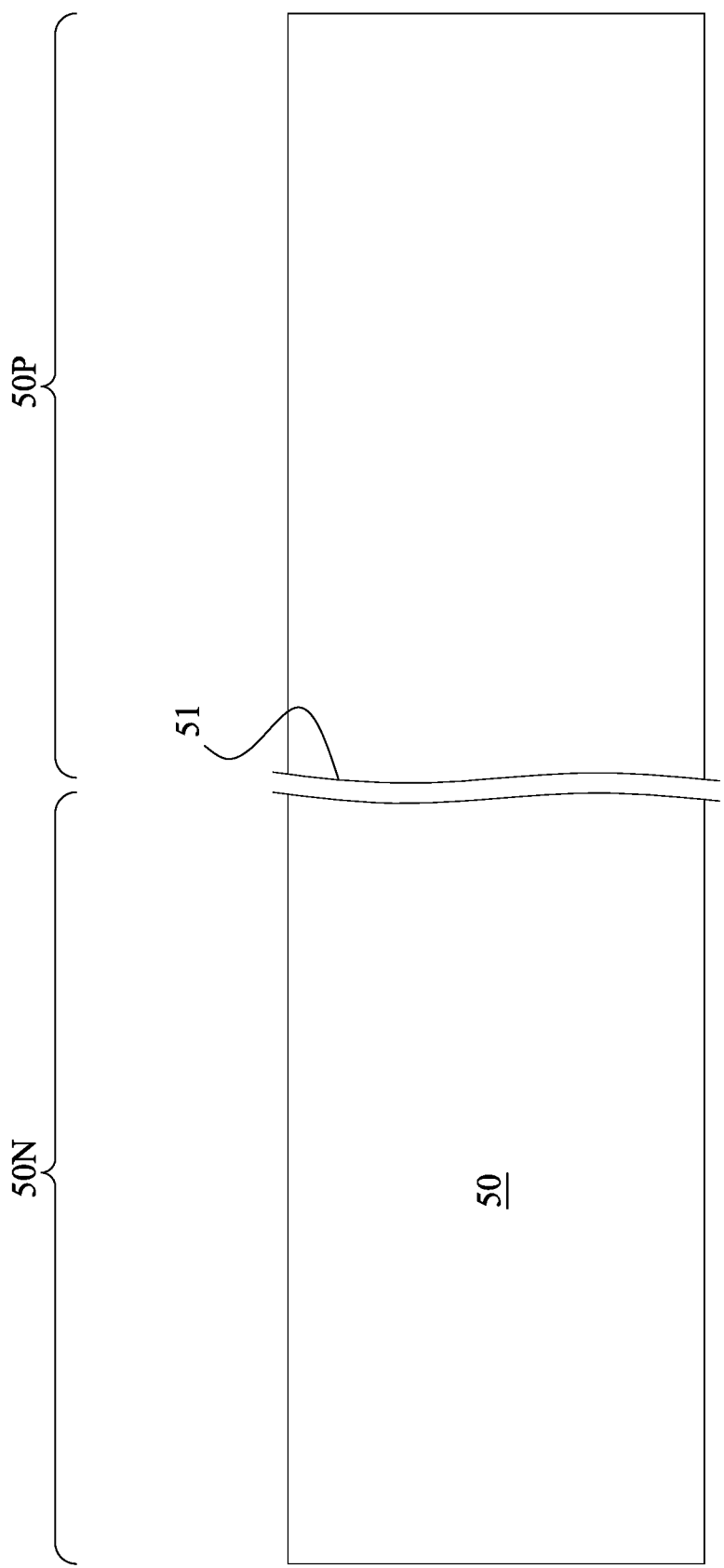

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 50 has an n-type region 50N (e.g., an NMOS region) and a p-type region 50P (e.g., a PMOS region). The n-type region 50N can be for forming n-type devices, such as NMOS transistors, e.g., n-type FinFETs. The p-type region 50P can be for forming p-type devices, such as PMOS transistors, e.g., p-type FinFETs. The n-type region 50N may be physically separated from the p-type region 50P (as illustrated by divider 51), and any number of device features (e.g., other active devices, doped regions, isolation structures, etc.) may be disposed between the n-type region 50N and the p-type region 50P.

Figure 3:
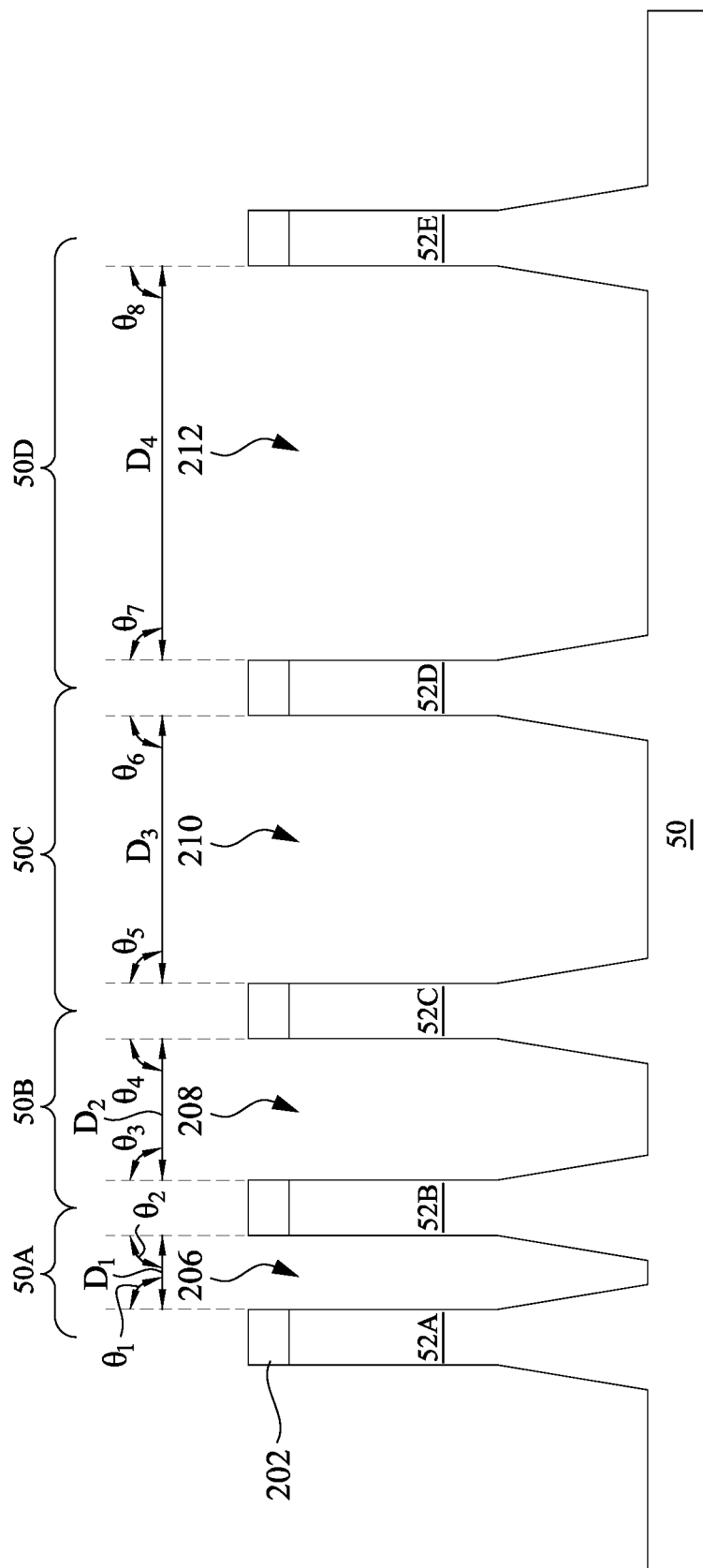

In FIG. 3, fins 52 are formed in the substrate 50. The fins 52 are semiconductor strips. In some embodiments, the fins 52 may be formed in the substrate 50 by etching trenches in the substrate 50. The etching may be any acceptable etch process, such as a reactive ion etch (RIE), neutral beam etch (NBE), the like, or a combination thereof. The etch may be anisotropic. All figures from here on illustrate features in either of the n-type region 50N and the p-type region 50P. For example, the structures may be applicable to both the n-type region 50N and the p-type region 50P. Differences (if any) in the structures of the n-type region 50N and the p-type region 50P are described in the text accompanying each figure.

The fins 52 may be patterned by any suitable method. For example, the fins 52 may be patterned by forming a mask 202 over the substrate 50 and using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins. Although not specifically illustrated, in some embodiments, the mask 202 comprises a plurality of layers, such as an oxide (e.g., silicon oxide), a nitride (e.g., silicon nitride), and a hardmask at the very top. As illustrated, in some embodiments, the masks 202 (or other layer) may remain on the fins 52.

The process described is just one example of how the fins 52 may be formed. In some embodiments, the fins 52 may be formed by an epitaxial growth process. For example, a dielectric layer can be formed over a top surface of the substrate 50, and trenches can be etched through the dielectric layer to expose the underlying substrate 50. Homoepitaxial structures (e.g., silicon if the substrate 50 comprises silicon) can be epitaxially grown in the trenches, and the dielectric layer can be recessed such that the homoepitaxial structures protrude from the dielectric layer to form fins. Additionally, in some embodiments, heteroepitaxial structures (e.g., silicon germanium if the substrate 50 comprises silicon) can be used for the fins 52. For example, the fins 52 can be recessed, and a material different from the fins 52 may be epitaxially grown over the recessed fins 52. In such embodiments, the fins 52 comprise the recessed material as well as the epitaxially grown material disposed over the recessed material. In an even further embodiment, a dielectric layer can be formed over a top surface of the substrate 50, and trenches can be etched through the dielectric layer. Heteroepitaxial structures can then be epitaxially grown in the trenches using a material different from the substrate 50, and the dielectric layer can be recessed such that the heteroepitaxial structures protrude from the dielectric layer to form the fins 52. In some embodiments where homoepitaxial or heteroepitaxial structures are epitaxially grown, the epitaxially grown materials may be in situ doped during growth, which may obviate prior and subsequent implantations although in situ and implantation doping may be used together.

Still further, it may be advantageous to epitaxially grow a material in the n-type region 50N different from the material in the p-type region 50P. In various embodiments, upper portions of the fins 52 may be formed from silicon-germanium ($Si_xGe_{1-x}$, where x can be in the range of 0 to 1), silicon carbide, pure or substantially pure germanium, a III-V compound semiconductor, a II-VI compound semiconductor, or the like. For example, the available materials for forming III-V compound semiconductor include, but are not limited to, indium arsenide, aluminum arsenide, gallium arsenide, indium phosphide, gallium nitride, indium gallium arsenide, indium aluminum arsenide, gallium antimonide, aluminum antimonide, aluminum phosphide, gallium phosphide, and the like.

As illustrated, the fins 52 may comprise a first fin 52A, a second fin 52B, a third fin 52C, a fourth fin 52D, and a fifth fin 52E. Note that any of the illustrated fins 52, such as the third fin 52C, the fourth fin 52D, and/or the fifth fin 52E, may represent a plurality of fins 52, such as two or more fins 52. It should also be noted that the fins 52 are illustrated in a representative fashion, and they may not necessarily be adjacent to one another on the substrate 50. For example, the first fin 52A and the second fin 52B represent an example of those two fins 52 being adjacent to one another in a first region 50A. The second fin 52B and the third fin 52C represent an example of those two fins 52 being adjacent to one another in a second region 50B, wherein the second fin 52B in the first region 50A may be the same or different from the analogous second fin 52B in the second region 50B. The third fin 52C and the fourth fin 52D represent an example of those two fins 52 being adjacent to one another in a third region 50C, wherein the third fin 52C in the second region 50B may be the same or different from the analogous third fin 52C in the third region 50C. The fourth fin 52D and the fifth fin 52E represent an example of those two fins 52 being adjacent to one another in a fourth region 50D, wherein the fourth fin 52D in the third region 50C may be the same as or different from the analogous fourth fin 52D in the fourth region 50D. As such, any of the above regions (e.g., the first region 50A, the second region 50B, the third region 50C, and the fourth region 50D) may be adjacent to another of those regions (as illustrated), may be nearby but separated on the substrate 50, or may be on completely different parts of the substrate 50.

The fins 52 may have varying lateral spacing from one another as may be utilized for certain types of circuit regions (e.g., logic or SRAM). For example, upper sidewalls of the first fin 52A and the second fin 52B across a first trench 206 may have a lateral distance $D_1$ of between about 10 nm and about 15 nm. Upper sidewalls of the second fin 52B and the third fin 52C across a second trench 208 may have a lateral distance $D_2$ of between about 12 nm and about 20 nm. Upper sidewalls of the third fin 52C and the fourth fin 52D across a third trench 210 may have a lateral distance $D_3$ of between about 18 nm and about 30 nm. Upper sidewalls of the fourth fin 52D and the fifth fin 52E across a fourth trench 212 may have a lateral distance $D_4$ of between about 25 nm and about 60 nm. As discussed in connection with subsequent steps, isolation regions and dummy fins may be formed in the first trench 206, the second trench 208, the third trench 210, and/or the fourth trench 212, respectively.

As further illustrated, upper sidewalls of each of the fins 52 may have angles with respect to a major plane of the substrate 50. For example, the upper sidewall of the first fin 52A adjacent to the second fin 52B may have an angle $\theta_1$, the upper sidewall of the second fin 52B adjacent to the first fin 52A may have an angle $\theta_2$, the upper sidewall of the second fin 52B adjacent to the third fin 52C may have an angle $\theta_3$, the upper sidewall of the third fin 52C adjacent to the second fin 52B may have an angle $\theta_4$, the upper sidewall of the third fin 52C adjacent to the fourth fin 52D may have an angle $\theta_5$, the upper sidewall of the fourth fin 52D adjacent to the third fin 52C may have an angle $\theta_6$, the upper sidewall of the fourth fin 52D adjacent to the fifth fin 52E may have an angle $\theta_7$, and the upper sidewall of the fifth fin 52E adjacent to the fourth fin 52D may have an angle $\theta_8$. Each of these angles may be between about 85° and about 95°. In some embodiments all of these angles are substantially the same. In other embodiments, these angles vary within the range provided above.

Figure 4:
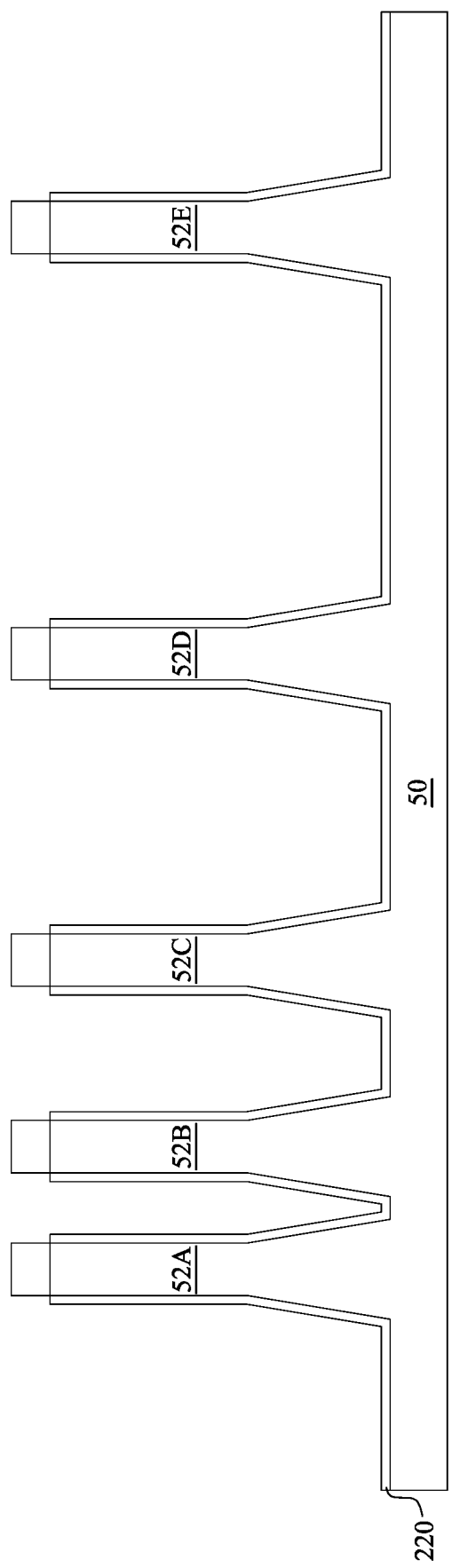

In FIG. 4, a liner layer 220 is formed over the fins 52 and the substrate 50. The liner layer 220 provides protection to the fins 52 during subsequent processes, including formation of adjacent oxide layers and processes that include heat and/or ambient oxygen (e.g., anneal processes). The liner layer 220 may comprise a semiconductor material, such as silicon (Si), silicon carbon (SiC), silicon germanium (SiGe), or the like. The liner layer 220 may be epitaxially grown using a process such as chemical vapor deposition (CVD), atomic layer deposition (ALD), vapor phase epitaxy (VPE), molecular beam epitaxy (MBE), or the like. As illustrated, in some embodiments, the liner layer 220 forms over the semiconductor (e.g., silicon or silicon-germanium) portions of the fins 52 and the substrate 50. The liner layer 220 may be deposited at a thickness of between about 12 Å and about 15 Å, such as about 13 Å.

Figure 5:
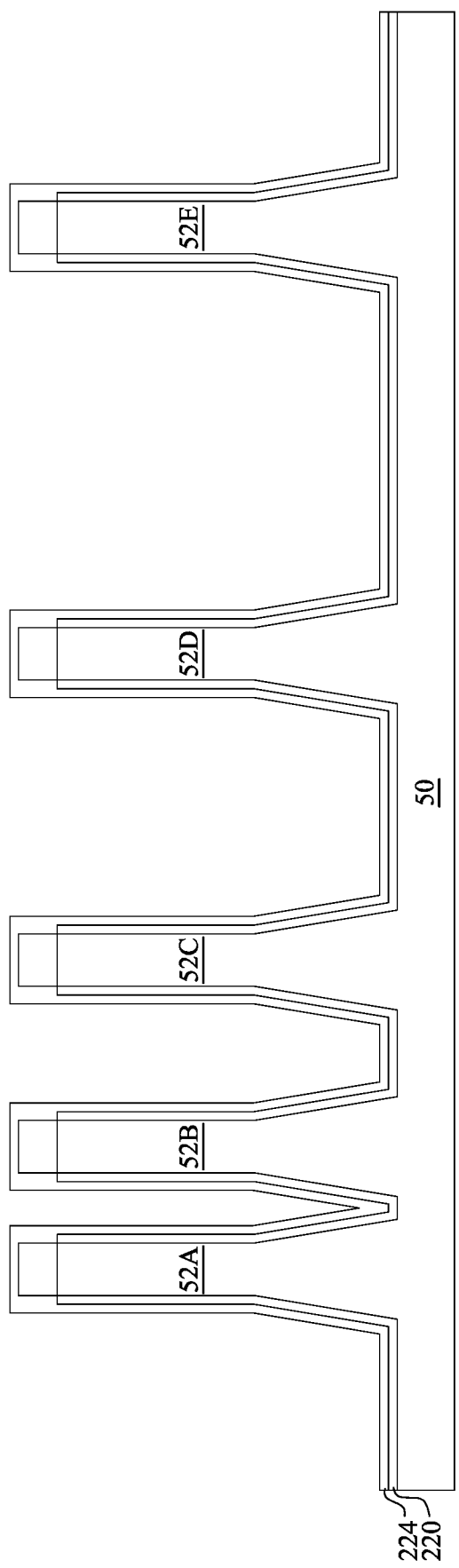

In FIG. 5, a first dielectric layer 224 is formed over the liner layer 220 as well as the fins 52 and the masks 202 (if present). The deposition of the first dielectric layer 224 may be performed using a conformal deposition process, such as ALD, CVD, the like, or any suitable process. The first dielectric layer 224 may comprise any suitable insulating material, such as silicon oxide ($SiO_x$) or the like, wherein x is between about 1.7 and about 2.0. The first dielectric layer 224 may be deposited at a thickness of between about 25 Å and about 30 Å, such as about 27.5 Å.

Figure 6:
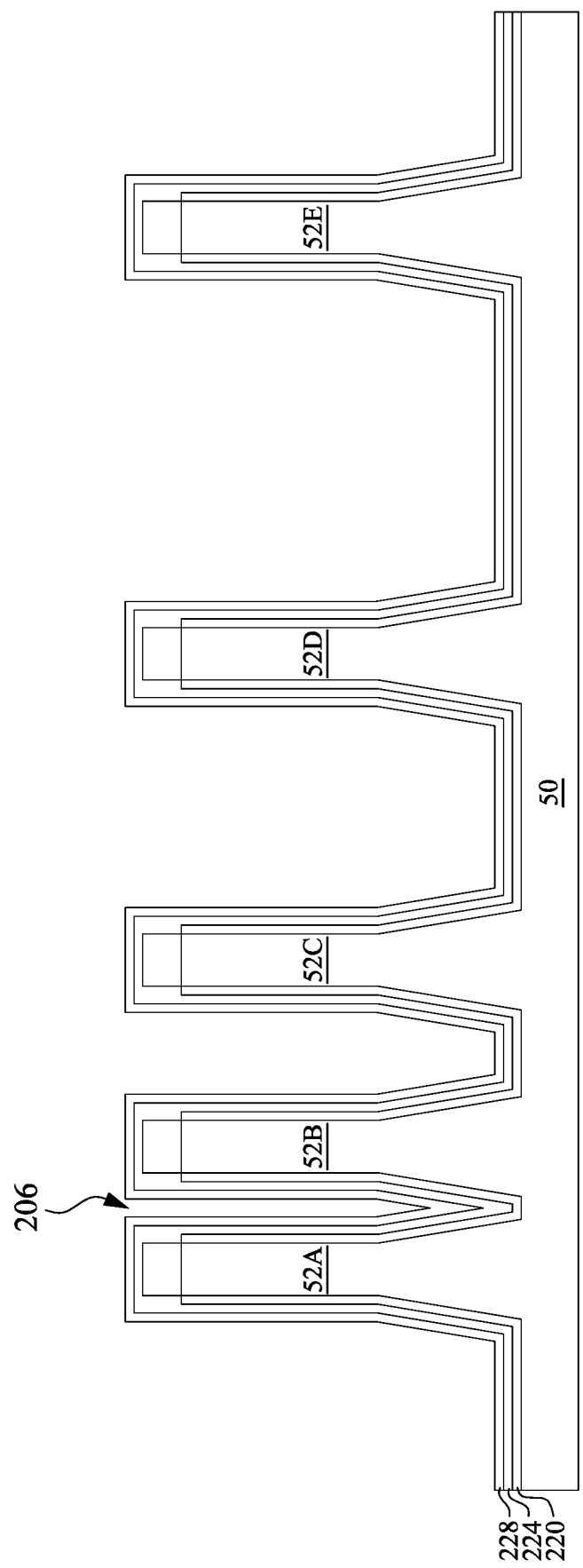

In FIG. 6, a second dielectric layer 228 is formed over the first dielectric layer 224. The deposition of the second dielectric layer 228 may be performed using a conformal deposition process, such as CVD (e.g., furnace CVD), ALD, the like, or any suitable process. The second dielectric layer 228 may comprise any suitable insulating material, such as silicon oxycarbonitride ($SiO_xC_yN_z$) or the like, wherein x is between about 1.8 and about 2.2, y is between about 0.03 and about 0.05, and z is between about 0.3 and about 0.5. The second dielectric layer 228 may be deposited at a thickness of between about 35 Å and about 40 Å, such as about 40 Å.

Figure 7:
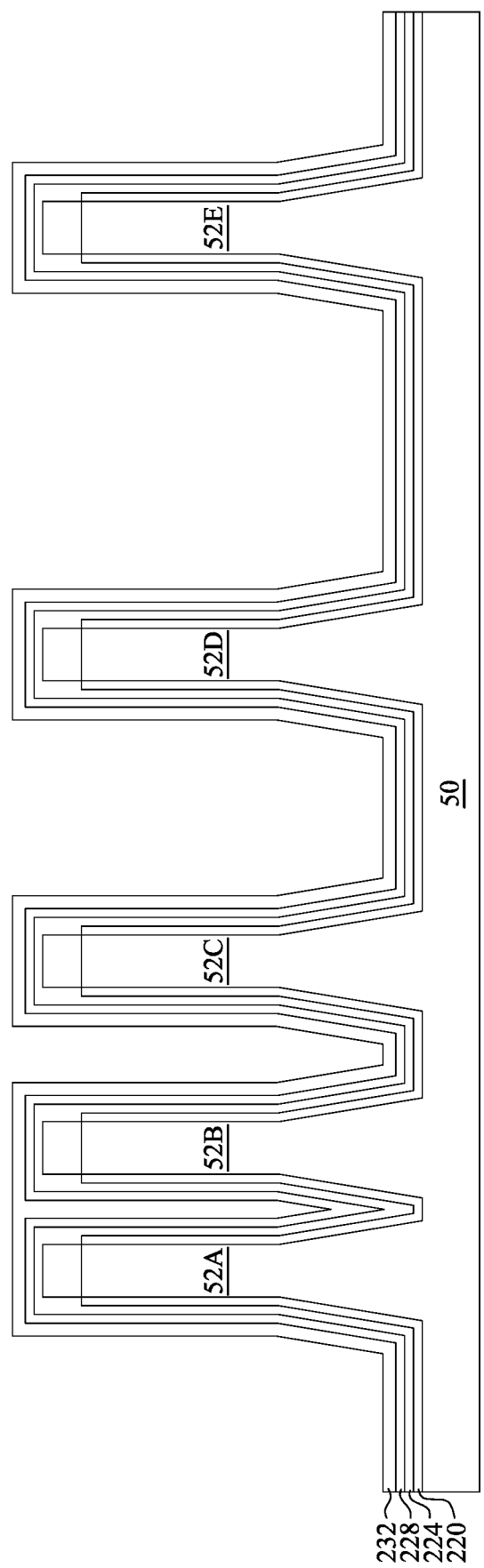

In FIG. 7, a third dielectric layer 232 is formed over the second dielectric layer 228. The third dielectric layer 232 may fill in remaining portions of the first trench 206. The third dielectric layer 232 may be an oxide such as silicon oxide, a nitride such as silicon nitride, the like, or a combination thereof, and may be formed by flowable CVD (FCVD), high-density plasma CVD (HDP-CVD), the like, or a combination thereof. Other insulation materials formed by any acceptable process may be used. For example, in embodiments in which the third dielectric layer 232 comprises silicon oxide ($SiO_x$), x may be between about 1.7 and about 2.0. The third dielectric layer 232 may be deposited at a thickness of between about 18 Å and about 20 Å.

Figure 8:
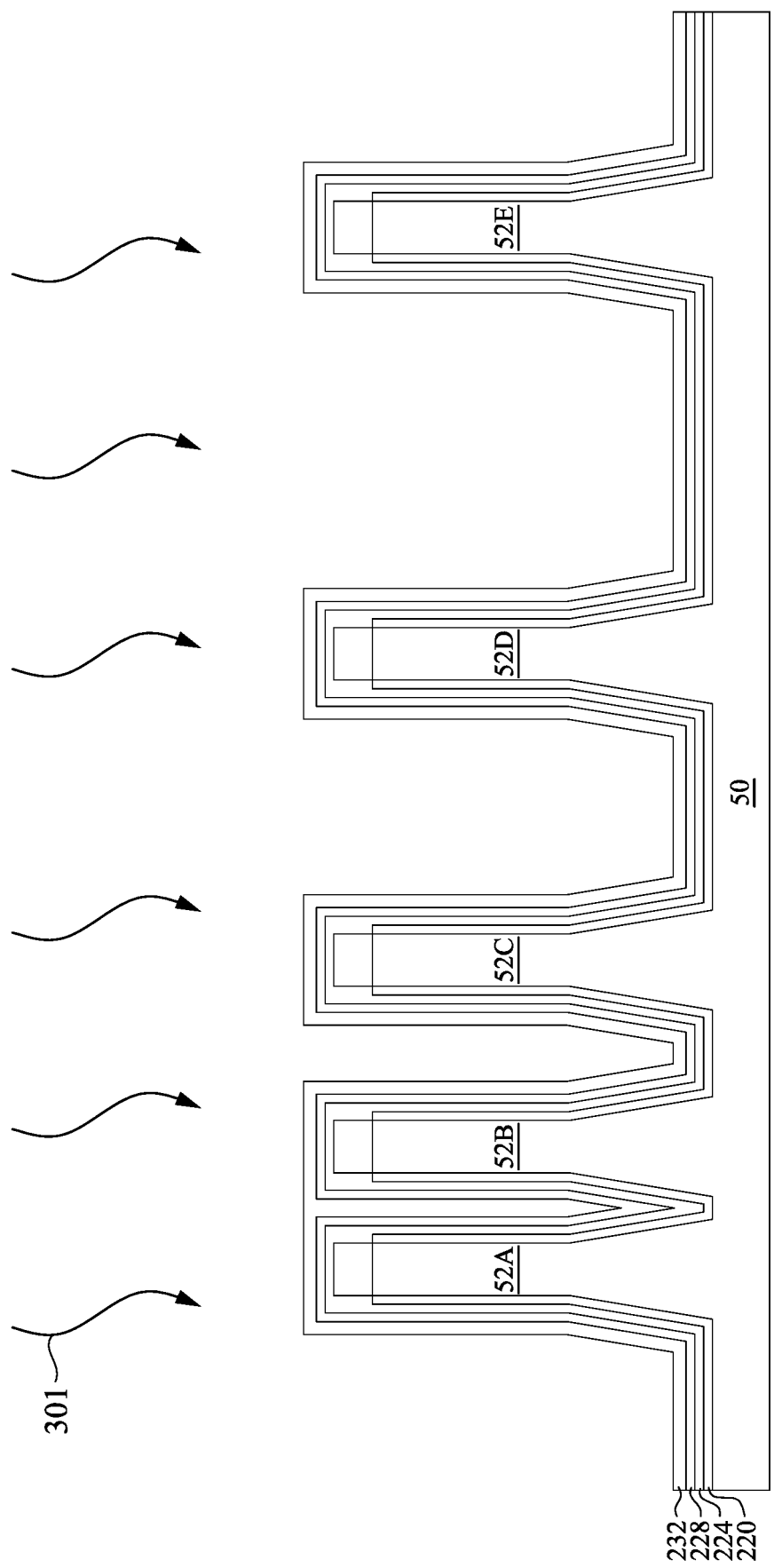

In FIG. 8, an anneal process 301 is performed on the structure. In some embodiments, the anneal process 301 may be performed in an oxidizing atmosphere, such as with oxygen ($O_2$) and/or hydrogen ($H_2$). As a result of the oxidizing atmosphere, the anneal process 301 may further oxidize portions of the second dielectric layer 228 by replacing, for example, some or all of the nitrogen. As such, following the anneal process 301, the second dielectric layer 228 may be a further oxidized form of silicon oxycarbonitride ($SiO_xC_yN_z$), wherein x is between about 2 and about 3, y is between about 0.03 and about 0.05, and z is between about 0 and about 0.02. In addition, following the anneal process 301, the third dielectric layer 232 may become a further oxidized form of silicon oxide ($SiO_x$), wherein x is between about 1.9 and about 2.1.

Figure 9:
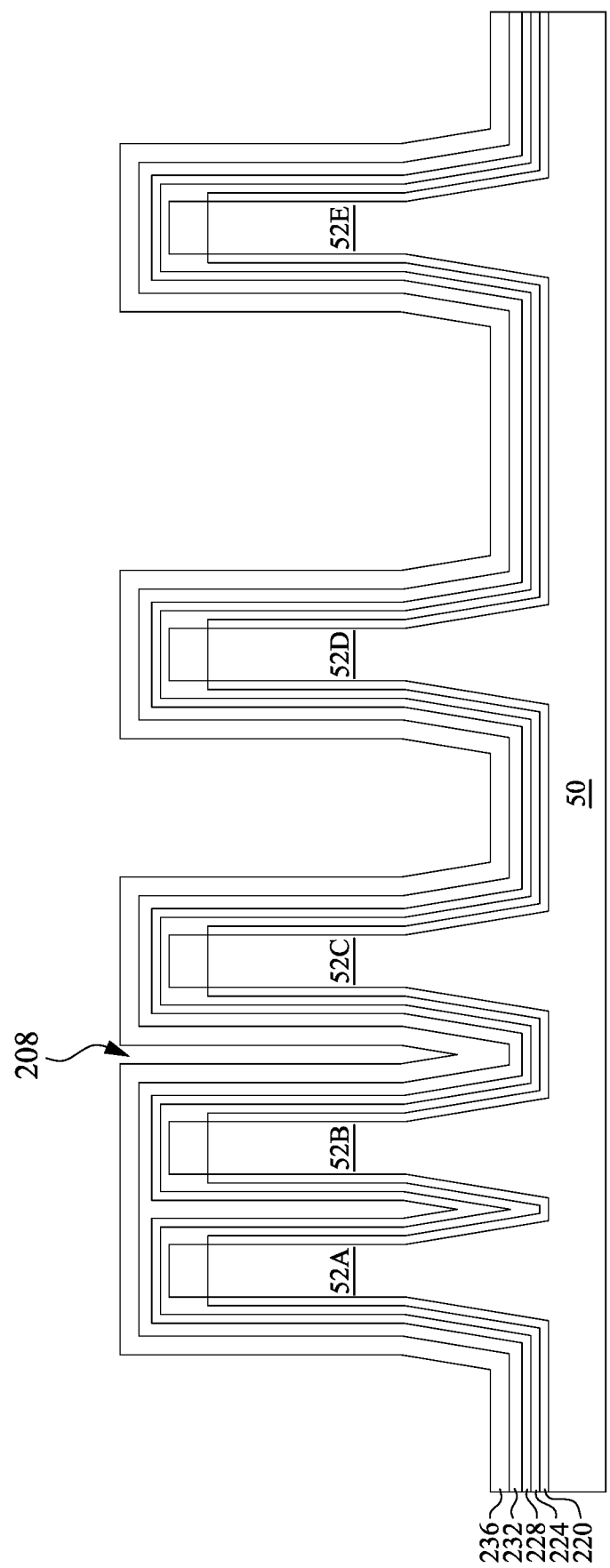

In FIG. 9, a fourth dielectric layer 236 is formed over the third dielectric layer 232. The deposition of the fourth dielectric layer 236 may be performed using a conformal deposition process, such as ALD, CVD, furnace CVD, plasma enhanced CVD (PECVD), atmospheric pressure CVD (APCVD), low pressure CVD (LPCVD), ultra high vacuum CVD (UHVCVD), aerosol assisted CVD (AACVD), direct liquid injection CVD (DLICVD), microwave plasma CVD (MPCVD), remote plasma enhanced CVD (RPECVD), hot-wire CVD (HWCVD), hybrid physical-chemical vapor deposition (HPCVD), rapid thermal CVD (RTCVD), the like, or any suitable process. The fourth dielectric layer 236 may comprise any suitable insulating material (e.g., including a ceramic material), including a silicon oxynitride such as silicon oxycarbonitride ($SiO_xC_yN_z$), or the like, wherein x is between about 1.8 and about 2.2, y is between about 0.03 and about 0.05, and z is between about 0.3 and about 0.5. The fourth dielectric layer 236 may be deposited at a thickness of between about 45 Å and about 50 Å, such as about 50 Å. In addition, the fourth dielectric layer 236 may be formed with a porosity of between about 30% and about 60%. A porosity of greater than 50% allows the fourth dielectric layer 236 to provide strong protection to reduce or prevent bending of the fins 52 during subsequent processing (e.g., deposition of the fifth dielectric layer 240), as discussed below. In accordance with some embodiments, the fourth dielectric layer 236 may be deposited within a larger range, such as between about 10 Å and about 70 Å, to adjust the degree to which the fourth dielectric layer 236 applies or modifies a wafer stress (e.g., a stress to the fins 52). The fourth dielectric layer 236 may have a low dielectric constant, such as less than or about 5.

In accordance with other embodiments, the fourth dielectric layer 236 may be formed by depositing a dielectric material and then treating the dielectric material with nitrogen and/or carbon precursors to convert the dielectric material to a silicon oxynitride, such as silicon oxycarbonitride, as discussed above. For example, a silicon oxide material may be deposited and treated with a plasma formed from nitrogen and/or carbon precursors or a gas comprising nitrogen-containing and/or carbon-containing gases. During the treatment, the plasma or gases diffuse into the dielectric material to convert it to the fourth dielectric layer 236. In some embodiments, the treatment is performed directly on the third dielectric layer 232 without first depositing the dielectric material discussed herein. For example, the plasma or gases may diffuse into an upper region of the third dielectric layer 232 to convert the upper region to the fourth dielectric layer 236, such as converting silicon oxide into a silicon oxynitrdie, such as silicon oxycarbonitride. The various processes described for forming the fourth dielectric layer 236 allow for adjusting the strength and/or strains formed in the structure (e.g., in the fourth dielectric layer 236 and/or the fins 52).

Figure 10:
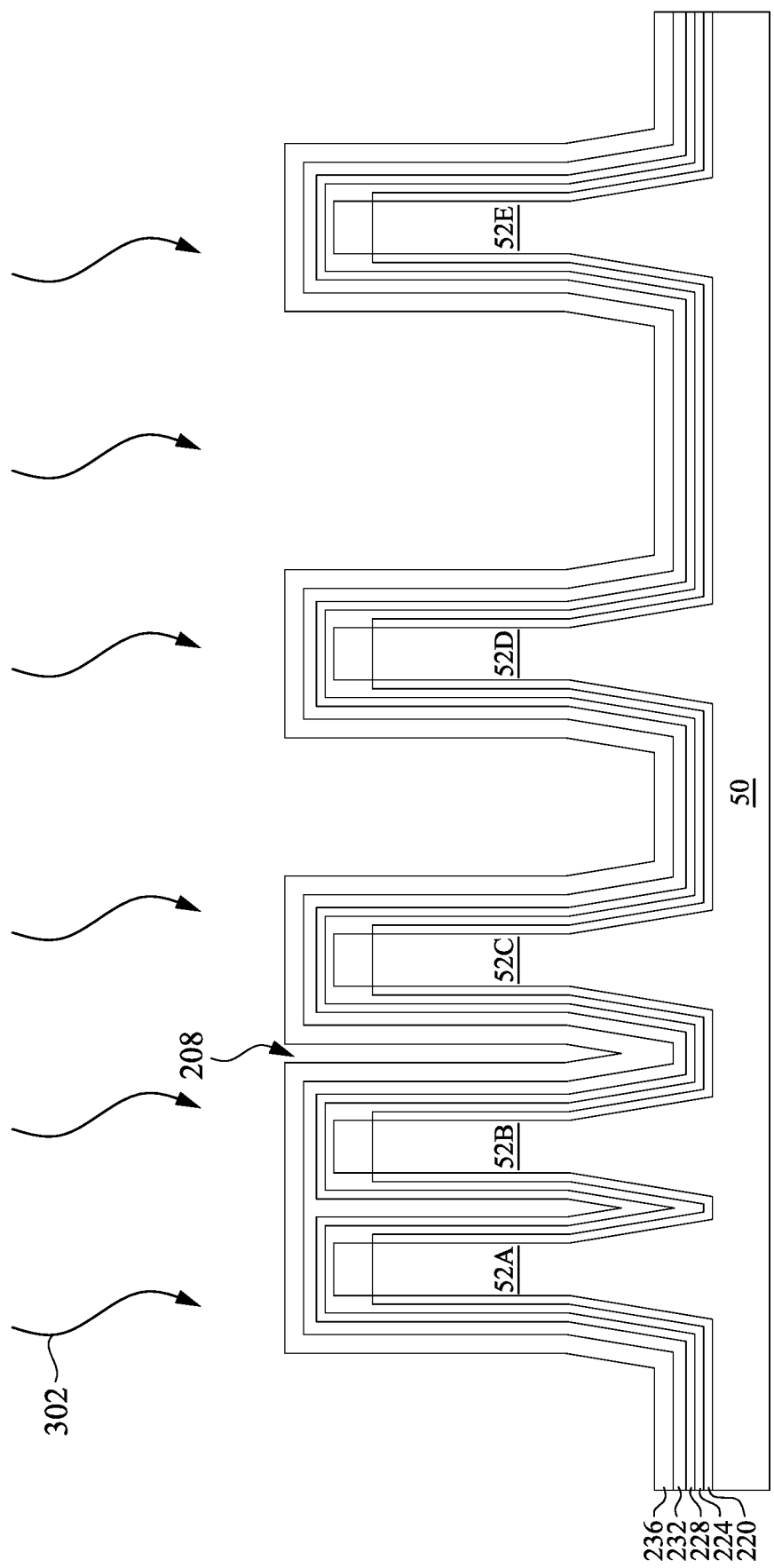

In FIG. 10, an anneal process 302 is performed on the structure. In some embodiments, the anneal process 302 may be performed in an oxidizing atmosphere, such as with oxygen ($O_2$) and/or hydrogen ($H_2$). As a result of the oxidizing atmosphere, the anneal process 302 may further oxidize portions of the fourth dielectric layer 236 by replacing, for example, some or all of the nitrogen. The anneal process 302 may be performed at temperatures of between about 400° C. and about 800° C. and at pressures of between about 100 Pascal and about 1200 Pascal. In addition, the anneal process 302 may be performed with or without a plasma process. In embodiments in which the anneal process 302 comprises a plasma process, the plasma process may be performed at a power of between about 100 W and about 900 W. As such, in embodiments of full oxidizing the fourth dielectric layer 236, following the anneal process 302, the fourth dielectric layer 236 may be converted to silicon oxycarbide ($SiO_xC_y$), wherein x is between about 2 and about 3 and y is between about 0.03 and about 0.05. In other embodiments, such as partially oxidizing the fourth dielectric layer 236, following the anneal process 302, the fourth dielectric layer 236 remains silicon oxycarbonitride ($SiO_xC_yN_z$), wherein x is between about 1.8 and about 2.2, y is between about 0.03 and about 0.05, and z is between about 0.3 and about 0.5. The anneal process 302 may further cause an expansion of the fourth dielectric layer 236 by between about 5% and about 8%. As such, following the anneal process 302, the fourth dielectric layer 236 may have a thickness of between about 45 Å and about 54 Å.

Figure 11:
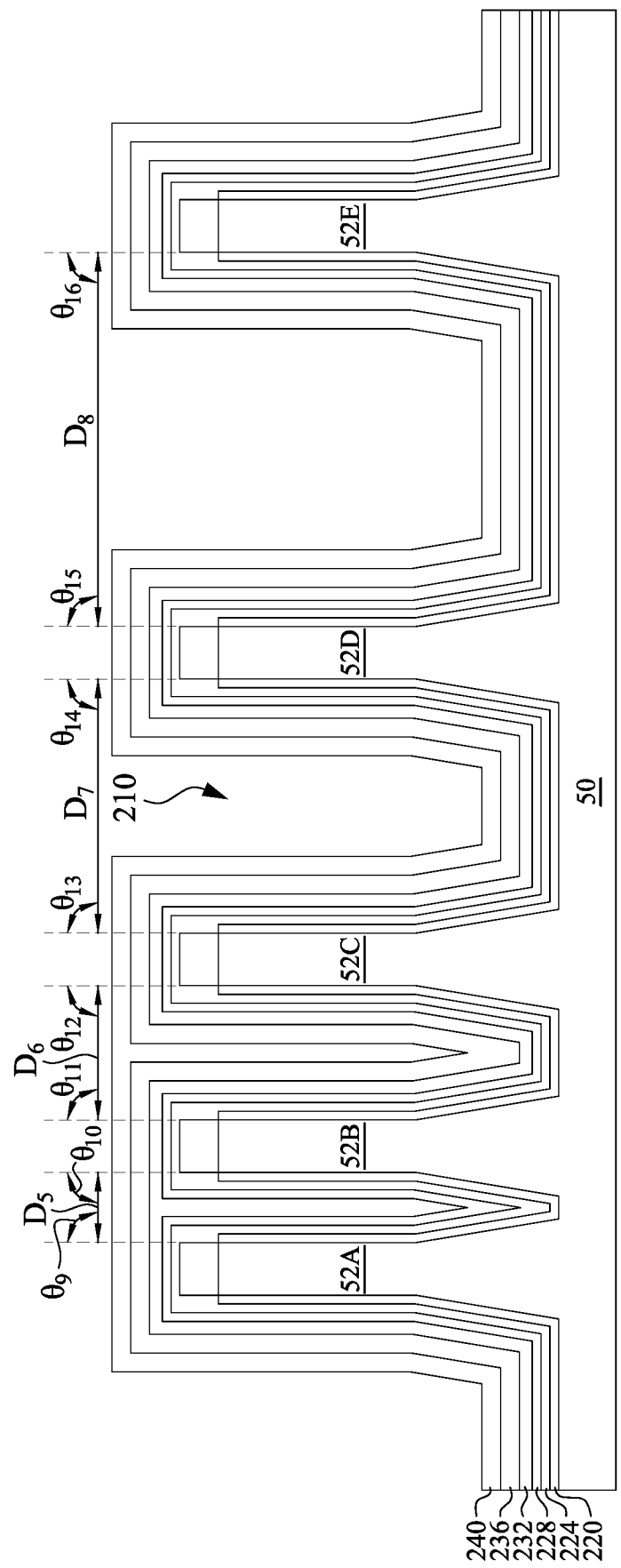

In FIG. 11, a fifth dielectric layer 240 is formed over the fourth dielectric layer 236. The fifth dielectric layer 240 may fill in remaining portions of the second trench 208. The deposition of the fifth dielectric layer 240 may be performed using a conformal deposition process, such as ALD, CVD, furnace CVD, PECVD, APCVD, LPCVD, UHVCVD, AACVD, DLICVD, MPCVD, RPECVD, HWCVD, HPCVD, RTCVD, the like, or any suitable process. The fifth dielectric layer 240 may comprise any suitable insulating material, such as silicon oxide ($SiO_x$) or the like, wherein x is between about 1.8 and about 2.1. The fifth dielectric layer 240 may be deposited at a thickness of between about 18 Å and about 21 Å, such as about 20 Å. For example, a total thickness of the fourth dielectric layer 236 and the fifth dielectric layer 240 may be between about 70 Å and about 75 Å, such as about 74 Å. Forming the fourth dielectric layer 236 and the fifth dielectric layer 240 to a combined thickness of at least about 115 Å ensures that the layers fill an entirety of the second trench 208, which prevents seams or voids from forming between the second fin 52B and the third fin 52C. In addition, the combined thickness being at most about 125 Å ensures that enough space remains in the third trench 210 to form a dummy fin, as discussed below.

It should be noted that formation of the fifth dielectric layer 240 comprising, for example, silicon oxide tends to create a stress, which could affect some or all of the fins 52. The fourth dielectric layer 236 comprising, for example, silicon oxycarbonitride, as discussed above, will not form this same type of stress on the fins 52. For example, without the presence of the fourth dielectric layer 236, formation of the fifth dielectric layer 240 may result in an inward stress between sidewalls of the fifth dielectric layer 240, thereby transferring some of the stress to directly opposing sides of the first fin 52A and the second fin 52B. Ordinarily, such as without the presence of the fourth dielectric layer 236, the stress would push and bend the first fin 52A and the second fin 52B inward toward one another and/or form an inward strain in the first fin 52A and the second fin 52B. In addition, this stress would pull the second fin 52B away from the third fin 52C. To a lesser extent, this stress may also be present from a sidewall of the fifth dielectric layer 240 along an opposing side of the third fin 52C in a direction toward the second fin 52B. Ordinarily, this stress would push and bend the third fin 52C toward the second fin 52B and/or form a strain in the third fin 52C in that direction. However, the fourth dielectric layer 236 forms a protective barrier around the first fin 52A, the second fin 52B, and the third fin 52C in order to prevent or reduce any movement of (and/or strain in) the first fin 52A, the second fin 52B, and/or the third fin 52C that would otherwise be caused by the fifth dielectric layer 240. Further, the anneal process 302 discussed above relieves stress that may form in the fourth dielectric layer 236 during deposition to ensure that the fourth dielectric layer 236 itself does not carry a stress that would cause movement or a strain in the first fin 52A, the second fin 52B, and/or the third fin 52C.

Still referring to FIG. 11, following formation of the fifth dielectric layer 240, the fins 52 (e.g., the first fin 52A, the second fin 52B, the third fin 52C, the fourth fin 52D, and the fifth fin 52E) may experience little to none of the movement or bending discussed above. In addition, the fins 52 may experience little to none of the internal strain discussed above. For example, these results are shown by dimensions of the various fins 52, as discussed in greater detail below. As a reminder, although the fins 52 are illustrated as being adjacent to one another, each pair of the fins 52 may be located on different parts of the substrate 50. As such, the phenomena discussed below between various groupings of the fins 52 arise from layouts in which those particular fins 52 have arrangements that are the same as or similar to portions of the arrangement illustrated in the figures.

Regarding the first fin 52A and the second fin 52B, the upper sidewall of the first fin 52A adjacent to the second fin 52B may have an angle $\theta_9$ with respect to the major plane of the substrate 50 being between about 88° and about 92°. The upper sidewall of the second fin 52B adjacent to the first fin 52A may have an angle $\theta_{10}$ with respect to the major plane of the substrate 50 being between about 88° and about 92°. As a result, the absolute value of the difference between angle $\theta_9$ and angle $\theta_{10}$ may be less than about 1°. In addition, those upper sidewalls of the first fin 52A and the second fin 52B may have a lateral distance $D_5$ of between about 10 nm and about 15 nm, or being between about 95% and about 100% of the previous lateral distance $D_1$ (e.g., including a decrease in the lateral distance from $D_1$ to $D_5$). In some embodiments, the angle $\theta_9$ may be less than the angle $\theta_1$ due to minimal amounts of the movement or bending described above. In some sub-embodiments, the angle $\theta_{10}$ may also be less than the corresponding angle $\theta_2$. However, in other sub-embodiments, the angle $\theta_{10}$ may be substantially the same as the corresponding angle $\theta_2$. In regard to each of these embodiments, the amounts of movement or bending of the first fin 52A and/or the second fin 52B were impeded or reduced due to formation of the fourth dielectric layer 236, without which greater amounts of movement or bending would be expected. It should be noted that in any of these embodiments and sub-embodiments, the first fin 52A and/or the second fin 52B may experience an internal strain instead of the movement or bending.

Regarding the second fin 52B and the third fin 52C, the upper sidewall of the second fin 52B adjacent to the third fin 52C may have an angle $\theta_{11}$ with respect to the major plane of the substrate 50 being between about 88° and about 92°. The upper sidewall of the third fin 52C adjacent to the second fin 52B may have an angle $\theta_{12}$ with respect to the major plane of the substrate 50 being between about 88° and about 92°. As a result, the absolute value of the difference between angle $\theta_{11}$ and angle $\theta_{12}$ may be less than about 1°. In addition, those upper sidewalls of the second fin 52B and the third fin 52C may have a lateral distance $D_6$ of between about 12 nm and about 20 nm, or being between about 95% and about 100% of the previous lateral distance $D_2$ (e.g., including a decrease in the lateral distance $D_2$ to $D_6$ due to slight bending of the third fin 52C toward the second fin 52B). In other embodiments, the lateral distance $D_6$ may be greater than the previous lateral distance $D_2$ (e.g., the previous lateral distance $D_2$ being between about 95% and about 100% of the lateral distance $D_6$) due to the second fin 52B bending toward the first fin 52A by a greater amount than the third fin 52C bending (if at all) toward the second fin 52B, while the lateral distance $D_5$ may be less than the previous lateral distance $D_1$ due the second fin 52B bending toward the first fin 52A. In regard to any of the embodiments and sub-embodiments regarding the angle $\theta_9$ and the angle $\theta_{10}$ discussed in the previous paragraph, the angle $\theta_{12}$ may be less than the corresponding angle $\theta_4$ due to movement or bending of the third fin 52C toward the second fin 52B. For example, a difference between the angle $\theta_2$ and the angle $\theta_{10}$ may be greater than a difference between the angle $\theta_4$ and the angle $\theta_{12}$.

Regarding the third fin 52C and the fourth fin 52D, the upper sidewall of the third fin 52C adjacent to the fourth fin 52D may have an angle $\theta_{13}$ with respect to the major plane of the substrate 50 being between about 88° and about 92°. The upper sidewall of the fourth fin 52D adjacent to the third fin 52C may have an angle $\theta_{14}$ with respect to the major plane of the substrate 50 being between about 88° and about 92°. As a result, the absolute value of the difference between angle $\theta_{13}$ and angle $\theta_{14}$ may be less than about 1°. In addition, those upper sidewalls of the third fin 52C and the fourth fin 52D may have a lateral distance $D_7$ of between about 18 nm and about 30 nm, or being between about 95% and about 100% of the previous lateral distance $D_3$. Similarly as discussed in the previous paragraph with respect to the angle $\theta_{12}$, in regard to any of the embodiments and sub-embodiments regarding the angle $\theta_9$ and the angle $\theta_{10}$ discussed above, the angle $\theta_{13}$ may be greater than the corresponding angle $\theta_5$ due to movement or bending of the third fin 52C toward the second fin 52B.

Regarding the fourth fin 52D and the fifth fin 52E, the upper sidewall of the fourth fin 52D adjacent to the fifth fin 52E may have an angle $\theta_{15}$ with respect to the major plane of the substrate 50 being between about 88° and about 92°. The upper sidewall of the fifth fin 52E adjacent to the fourth fin 52D may have an angle $\theta_{16}$ with respect to the major plane of the substrate 50 being between about 88° and about 92°. As a result, the absolute value of the difference between angle $\theta_{15}$ and angle $\theta_{16}$ may be less than about 1°. In addition, those upper sidewalls of the fourth fin 52D and the fifth fin 52E may have a lateral distance $D_8$ of between about 25 nm and about 60 nm, or being between about 95% and about 100% of the previous lateral distance $D_4$.

Figure 12:
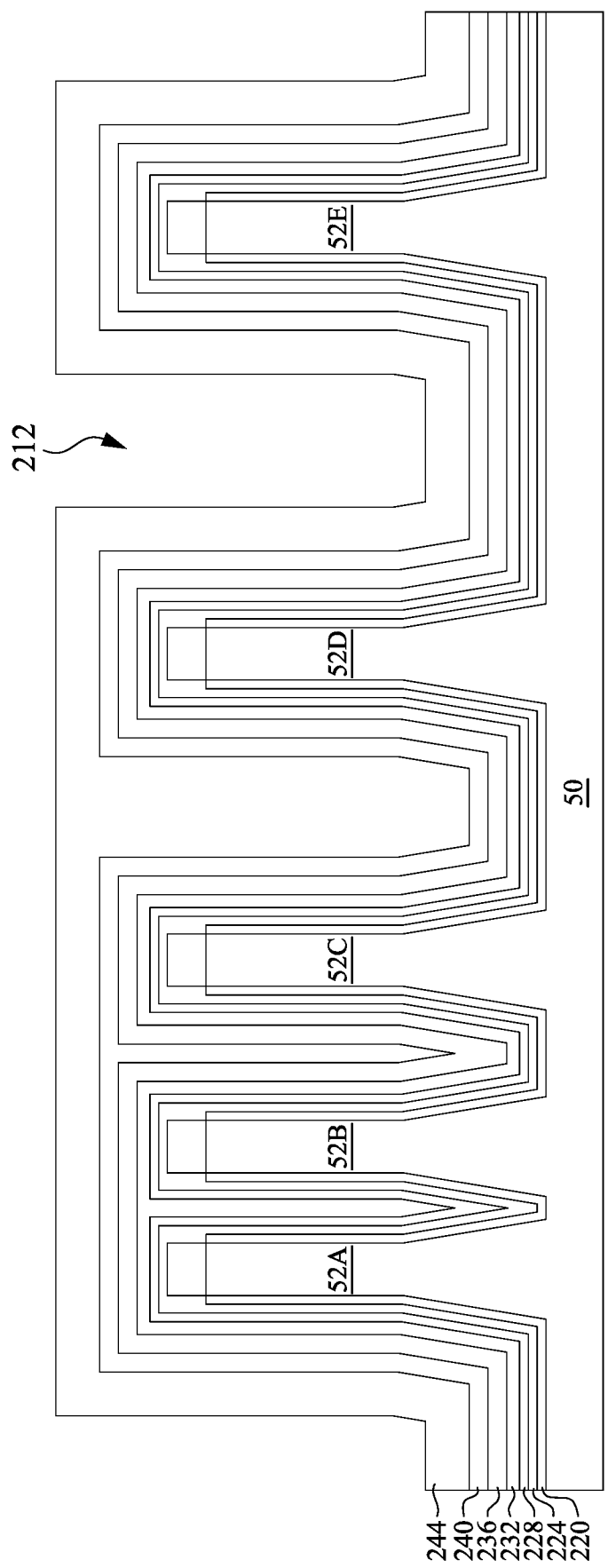

In FIG. 12, a sixth dielectric layer 244 is formed over the fifth dielectric layer 240. The sixth dielectric layer 244 may fill in remaining portions of the third trench 210. The deposition of the sixth dielectric layer 244 may be performed using a conformal deposition process, such as ALD, CVD, the like, or any suitable process. The sixth dielectric layer 244 may comprise a low-k dielectric material such as silicon carbonitride ($SiC_yN_z$), combinations thereof, or the like, wherein y is between about 0.06 and about 0.12 and z is between about 0.7 and about 1.2. The sixth dielectric layer 244 may be deposited at a thickness of between about 35 Å and about 40 Å.

Figure 13:
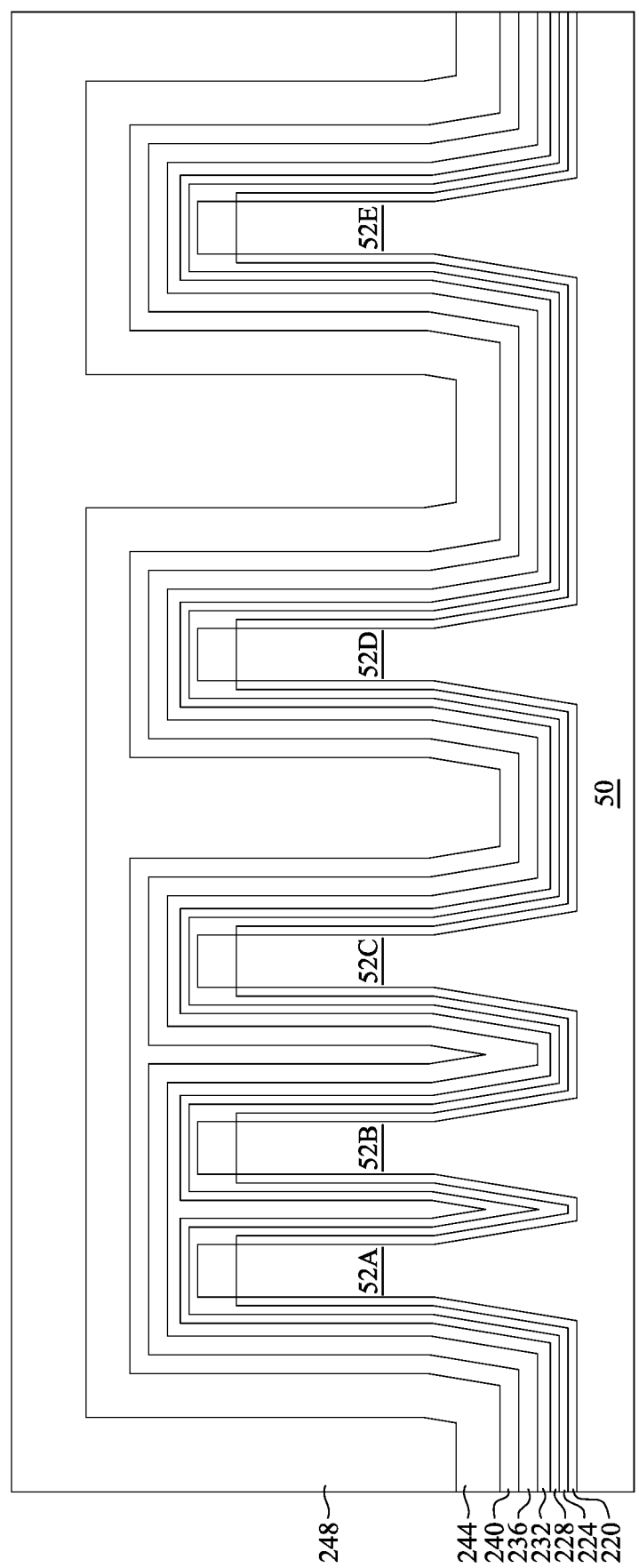

In FIG. 13, a seventh dielectric layer 248 is formed over the sixth dielectric layer 244. The seventh dielectric layer 248 may fill in remaining portions of the fourth trench 212. The seventh dielectric layer 248 may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used. In the illustrated embodiment, the seventh dielectric layer 248 is silicon oxide ($SiO_x$), wherein x is between about 1.6 and about 2.4, and formed by a FCVD process. An anneal process may be performed once the insulation material is formed. In an embodiment, the seventh dielectric layer 248 is formed such that excess covers the fins 52.

Figure 14:
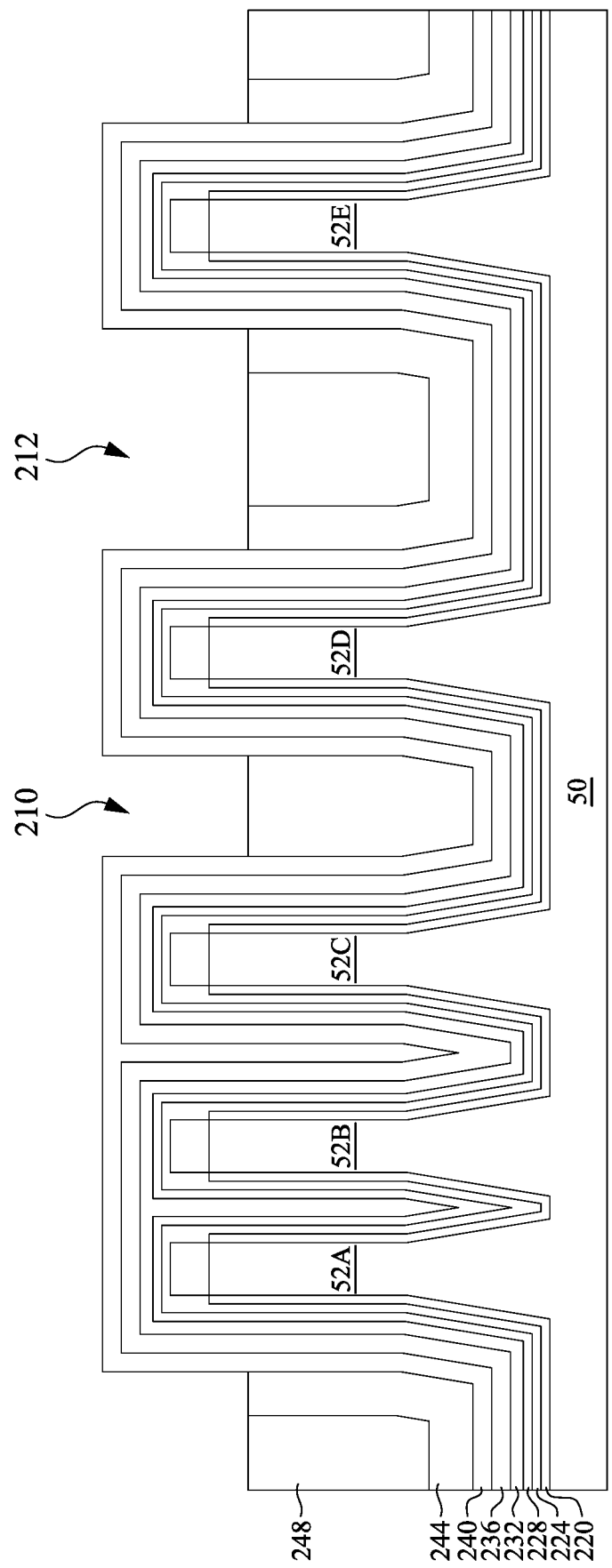

In FIG. 14, a removal process is applied to the sixth dielectric layer 244 and the seventh dielectric layer 248 from over the fins 52. In some embodiments, a planarization process is first performed using, for example, a chemical mechanical polish (CMP), an etch-back process, combinations thereof, or the like. The planarization process may expose the fifth dielectric layer 240 above tops of the fins 52. In accordance with some embodiments, after the planarization process, the sixth dielectric layer 244 and the seventh dielectric layer 248 are optionally recessed, thus reforming portions of the third trench 210 and the fourth trench 212 and further exposing the fifth dielectric layer 240 over sidewalls of the fins 52. The dielectric materials may be recessed using an acceptable etching process, such as one that is selective to those dielectric materials (e.g., selectively etches the material(s) of the sixth dielectric layer 244 and the seventh dielectric layer 248 at a faster rate than other materials, such as the material(s) of the fifth dielectric layer 240). In other embodiments, portions of the sixth dielectric layer 244 and the seventh dielectric layer 248 are anisotropically etched to reform portions of the third trench 210 and the fourth trench 212.

Figure 15:
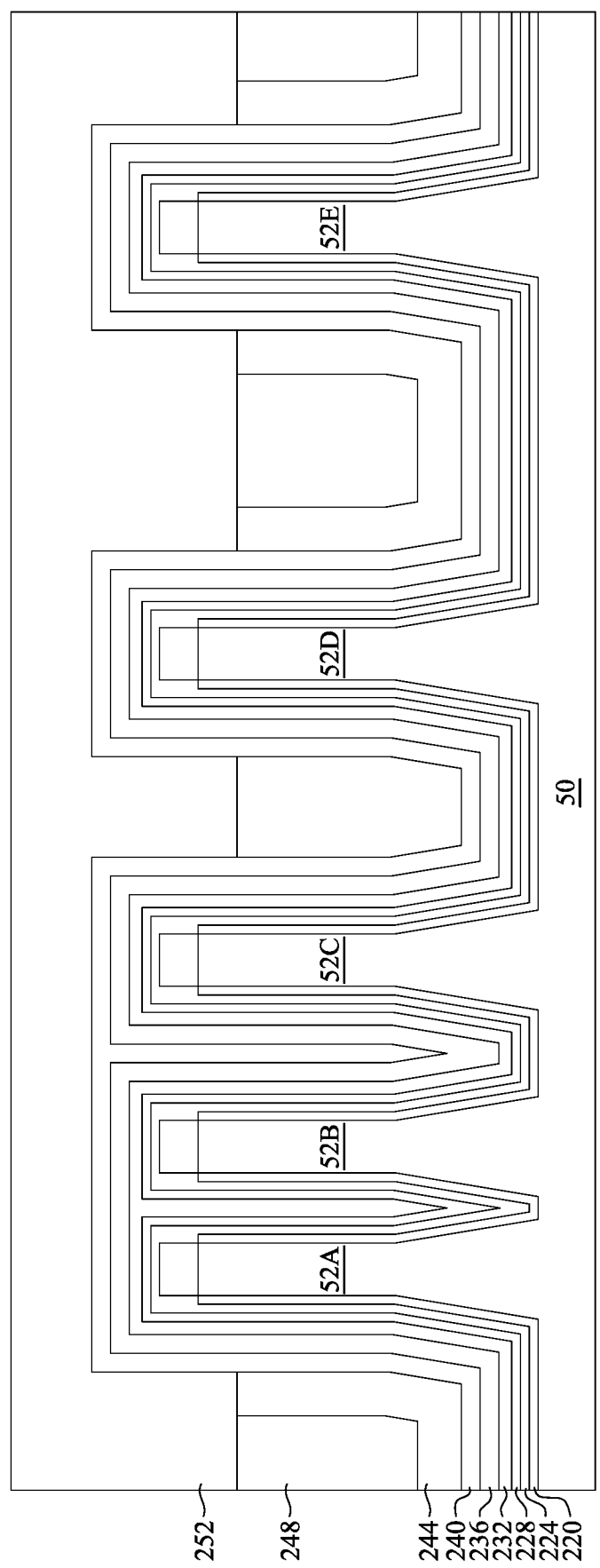

In FIG. 15, in embodiments in which portions of the third trench 210 and the fourth trench 212 are reformed, a helmet layer 252 may be formed over the structure and in the third trench 210, the fourth trench 212, and any other remaining trenches. The deposition of the helmet layer 252 may be performed using a conformal deposition process, such as ALD, CVD, molecular-beam deposition (MBD), physical deposition (PVD), the like, or an acceptable process. In some embodiments, the helmet layer 252 comprises high-k dielectric materials (e.g., those having a k-value of greater than about 7) such as hafnium oxide, zirconium oxide, zirconium aluminum oxide, hafnium aluminum oxide, hafnium silicon oxide, aluminum oxide, or the like; combinations thereof; or the like.

Figure 16:
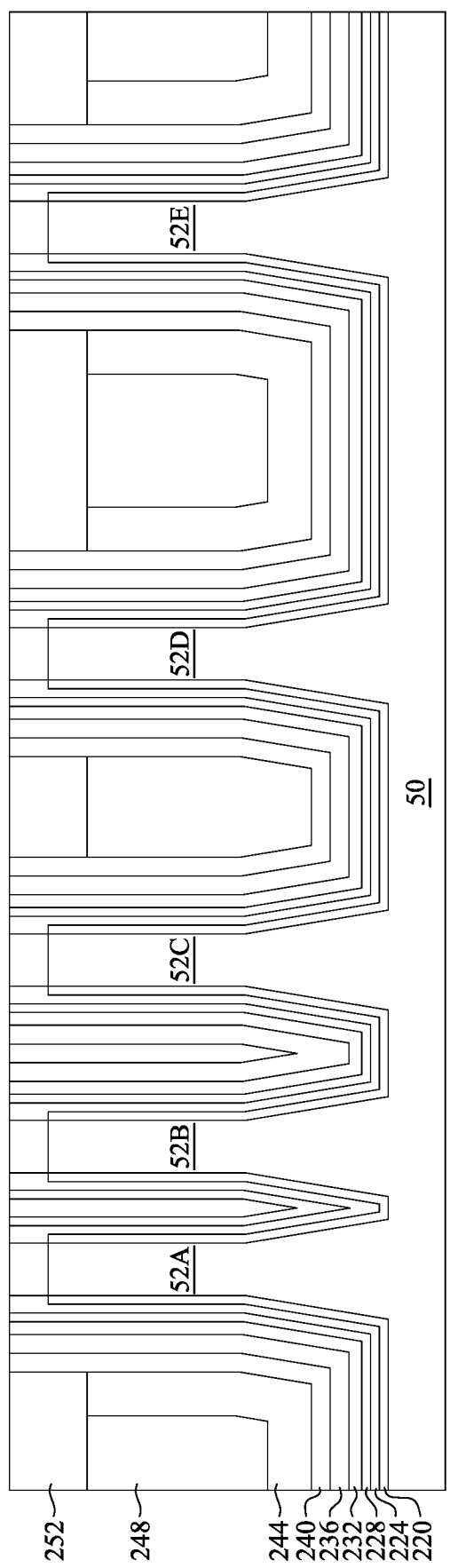

In FIG. 16, a removal process is then applied to remove excess material(s) of the helmet layer 252 as well as certain dielectric materials (e.g, the first dielectric layer 224, the second dielectric layer 228, the third dielectric layer 232, the fourth dielectric layer 236, and the fifth dielectric layer 240) from over the masks 202 (if present) and the fins 52. In some embodiments, a planarization process such as a CMP, a grinding process, an etch-back process, combinations thereof, or the like may be utilized. The planarization process exposes the masks 202 or the fins 52 such that top surfaces of the masks 202 or the fins 52, respectively, and the helmet layer 252 are coplanar (within process variations) after the planarization process is complete. In the illustrated embodiments, the masks 202 remain after the planarization process. In other embodiments, the masks 202 may also be removed by the planarization process.

As illustrated, in some embodiments, exposing the masks 202 results in upper surfaces of those dielectric materials (e.g., the first dielectric layer 224, the second dielectric layer 228, the third dielectric layer 232, the fourth dielectric layer 236, and the fifth dielectric layer 240), the masks 202, and the helmet layer 252 being coplanar (within process variations). In other embodiments, the removal process results in upper surfaces of those dielectric materials, the masks 202, and the helmet layer 252 being non-coplanar, such that the masks 202 protrude above those dielectric materials and the helmet layer 252. Variances in height may be due to the different material compositions of the various dielectric materials being polished/etched at different rates during an applicable planarization process. Although subsequent figures illustrate these upper surfaces as being coplanar for ease of illustration, it is understood that embodiments with non-coplanar upper surfaces are also contemplated in subsequent processing steps and/or subsequently described embodiments.

Figure 17:
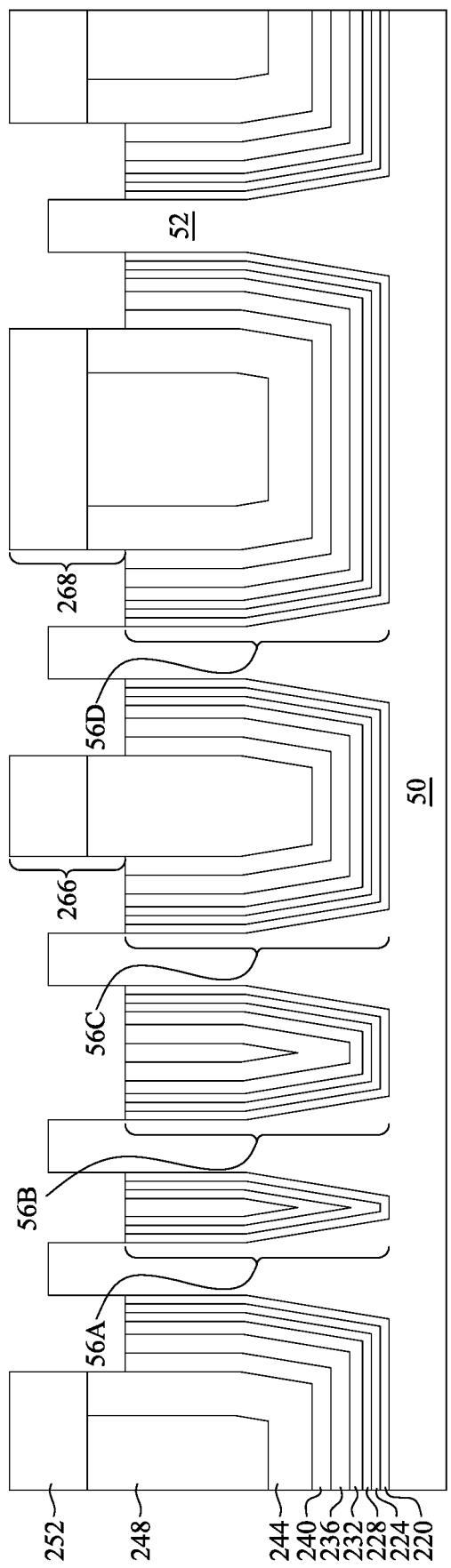

In FIG. 17, the masks 202 are removed and portions of the structure are recessed so that a first dummy fin 266, a second dummy fin 268, and the fins 52 extend from between certain remaining dielectric materials (e.g., the first dielectric layer 224, the second dielectric layer 228, the third dielectric layer 232, the fourth dielectric layer 236, and the fifth dielectric layer 240). The recessing removes the masks 202 from the fins 52 and portions of those certain remaining dielectric materials. In some embodiments and as illustrated, the recessing also removes portions of the liner layer 220, for example, if the liner layer 220 has become a dielectric material due to oxidization from nearby layers and previous processing steps (e.g., anneal processes). In other embodiments, such as if the liner layer 220 remains unoxidized, substantially all of the liner layer 220 may remain along the upper sidewalls of the fins 52 after the recessing. Those certain remaining dielectric materials may then be recessed using an acceptable etching process, such as one that is selective to those certain remaining dielectric materials and the masks 202. For example, the etching process may selectively etch those certain remaining dielectric materials and the material of the masks 202 at a faster rate than the materials of the fins 52 and the helmet layer 252. In some embodiments, those certain remaining dielectric materials may optionally be further trimmed after the masks 202 have been fully removed. Those certain remaining dielectric materials may then be etched using the same acceptable etching process or another acceptable etching process with greater selectivity toward etching those dielectric materials as compared to the fins 52 (and optionally to the helmet layer 252).

The removal and recessing steps described above form a first isolation region 56A, a second isolation region 56B, a third isolation region 56C, a fourth isolation region 56D, a first dummy fin 266, and a second dummy fin 268. As illustrated, the removal and recessing are performed such that portions of the fins 52, the first dummy fin 266, and the second dummy fin 268 protrude above top surfaces of those remaining dielectric materials.

For example, the first isolation region 56A comprises the illustrated dielectric materials interposed between the first fin 52A and the second fin 52B. The second isolation region 56B comprises the illustrated dielectric materials interposed between the second fin 52B and the third fin 52C. The first dummy fin 266 comprises the helmet layer 252 and an upper portion of the sixth dielectric layer 244 protruding above top surfaces of the other dielectric materials interposed between the third fin 52C and the fourth fin 52D. The third isolation region 56C comprises the illustrated dielectric materials and a lower portion of the sixth dielectric layer 244 directly interposed between the fifth dielectric layer 240. The second dummy fin 268 comprises the helmet layer 252 and upper portions of the sixth dielectric layer 244 and the seventh dielectric layer 248 protruding above top surfaces of the other dielectric materials interposed between the fourth fin 52D and the fifth fin 52E. The fourth isolation region 56D comprises the illustrated dielectric materials and lower portions of the sixth dielectric layer 244 and the seventh dielectric layer 248 directly interposed between the fifth dielectric layer 240.

As further illustrated, the first dummy fin 266 and the second dummy fin 268 have different material compositions than one another and than the fins 52. In addition, the first dummy fin 266 and the second dummy fin 268 are insulating fins and may also be referred to as hybrid fins. The first isolation region 56A, the second isolation region 56B, the third isolation region 56C, and the fourth isolation region 56D provide further electrical isolation between adjacent fins 52 and, accordingly, serve as shallow trench isolation (STI) regions between the fins 52 such that separate STI regions need not be formed.

Further in FIG. 17, appropriate wells (not shown) may be formed in the fins 52 and/or the substrate 50. In some embodiments, a P well may be formed in the n-type region 50N, and an N well may be formed in the p-type region 50P. In some embodiments, a P well or an N well are formed in both the n-type region 50N and the p-type region 50P.

In the embodiments with different well types, the different implant steps for the n-type region 50N and the p-type region 50P may be achieved using a photoresist and/or other masks (not shown). For example, a photoresist may be formed over the fins 52 and the isolation regions 56 in the n-type region 50N. The photoresist is patterned to expose the p-type region 50P of the substrate 50. The photoresist can be formed by using a spin-on technique and can be patterned using acceptable photolithography techniques. Once the photoresist is patterned, an n-type impurity implant is performed in the p-type region 50P, and the photoresist may act as a mask to substantially prevent n-type impurities from being implanted into the n-type region 50N. The n-type impurities may be phosphorus, arsenic, antimony, or the like implanted in the region to a concentration of equal to or less than $10^{18}$ cm$^{-3}$, such as between about $10_{16}$ cm$^{-3}$ and about $10^{18}$ cm$^{-3}$. After the implant, the photoresist is removed, such as by an acceptable ashing process.

Following the implanting of the p-type region 50P, a photoresist is formed over the fins 52 and the isolation regions 56 in the p-type region 50P. The photoresist is patterned to expose the n-type region 50N of the substrate 50. The photoresist can be formed by using a spin-on technique and can be patterned using acceptable photolithography techniques. Once the photoresist is patterned, a p-type impurity implant may be performed in the n-type region 50N, and the photoresist may act as a mask to substantially prevent p-type impurities from being implanted into the p-type region 50P. The p-type impurities may be boron, boron fluoride, indium, or the like implanted in the region to a concentration of equal to or less than $10^{18}$ cm$^{-3}$, such as between about $10^{16}$ cm$^{-3}$ and about $10^{18}$ cm$^{-3}$. After the implant, the photoresist may be removed, such as by an acceptable ashing process.

After the implants of the n-type region 50N and the p-type region 50P, an anneal may be performed to repair implant damage and to activate the p-type and/or n-type impurities that were implanted. In some embodiments, the grown materials of epitaxial fins may be in situ doped during growth, which may obviate the implantations, although in situ and implantation doping may be used together.

Figure 18:
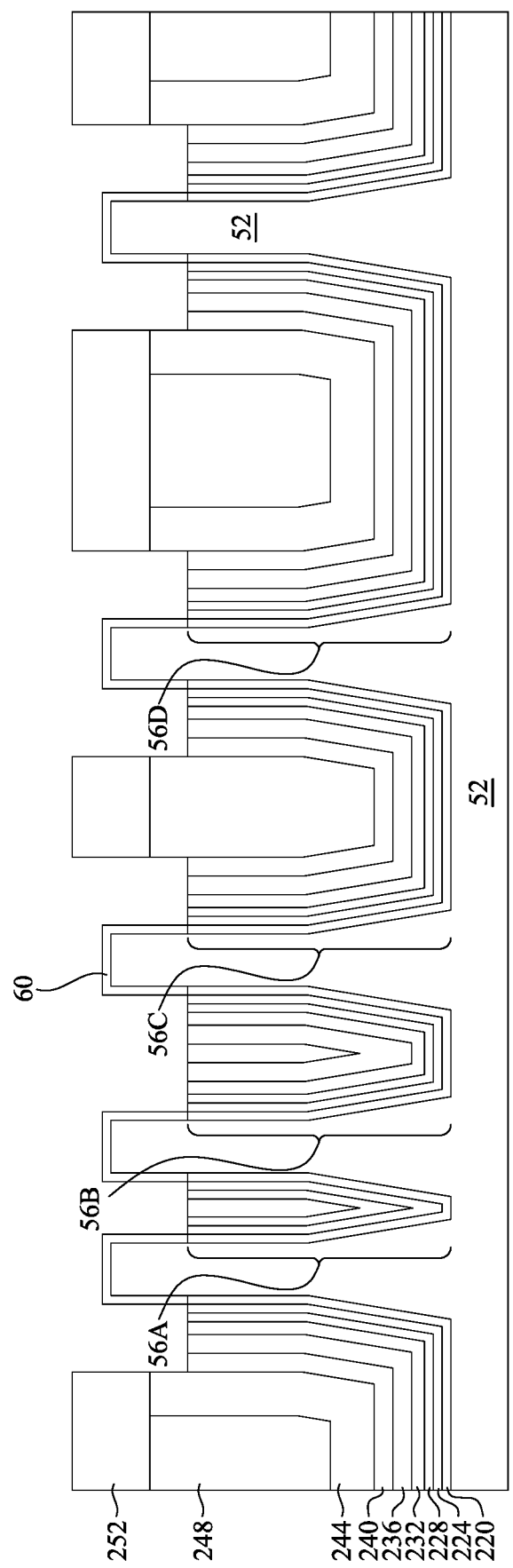

In FIG. 18, a dummy dielectric layer 60 is formed on the fins 52. The dummy dielectric layer 60 may be, for example, silicon oxide, silicon nitride, a combination thereof, or the like, and may be deposited (e.g., by CVD) or thermally grown according to acceptable techniques. It is noted that the dummy dielectric layer 60 is shown covering the fins 52 for illustrative purposes only. In other embodiments, the dummy dielectric layer 60 may be deposited such that the dummy dielectric layer 60 covers some or all of the exposed upper surfaces of the rest of the structure, such as between the fins 52 extending over the isolation regions 56 and/or the first and second dummy fins 266/268. The dummy dielectric layer 60 may form over the fins 52 as well as exposed surfaces of the liner layer 220.

Figure 19:
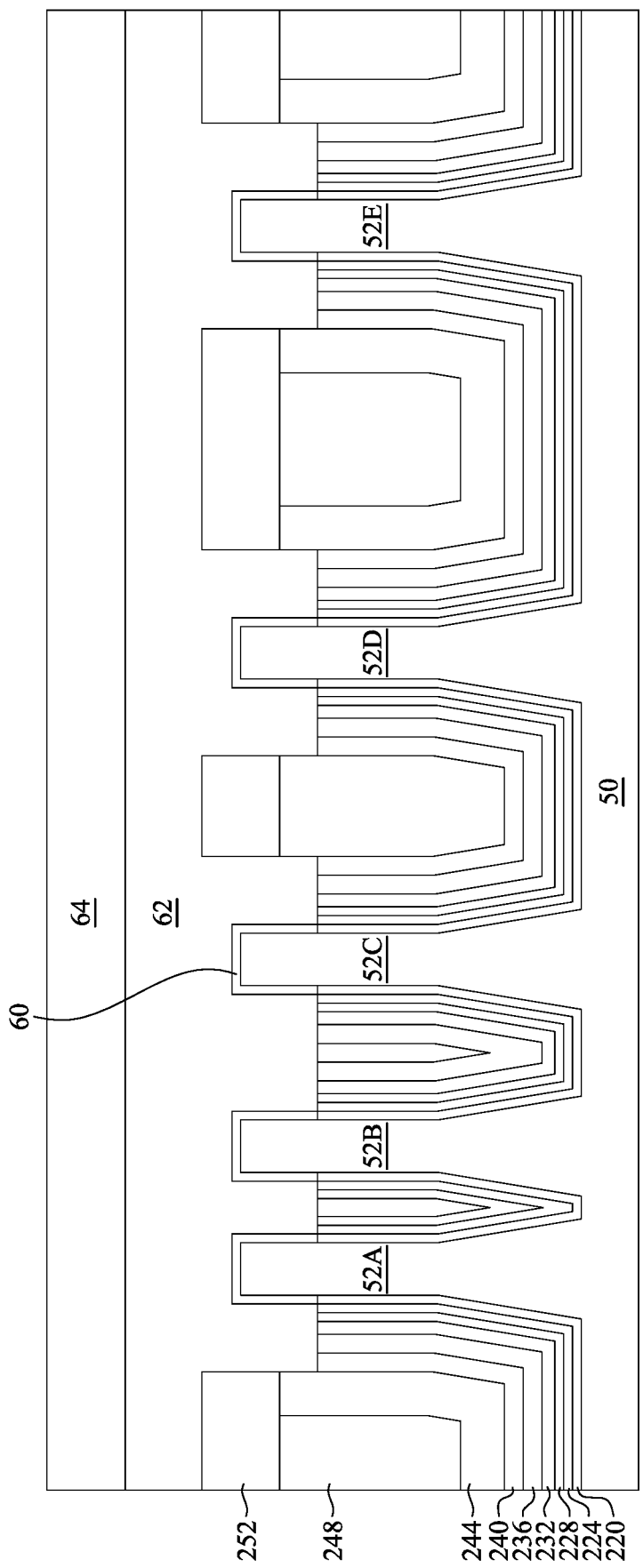

In FIG. 19, a dummy gate layer 62 is formed over the dummy dielectric layer 60, and a mask layer 64 is formed over the dummy gate layer 62. As a reminder, although the fins 52 are illustrated as being adjacent to one another, each pair of the fins 52 may be located on different parts of the substrate 50. As such, the fins 52 would not necessarily share the same dummy gate layer 62. The dummy gate layer 62 may be deposited over the dummy dielectric layer 60 and then planarized, such as by a CMP. The mask layer 64 may be deposited over the dummy gate layer 62. The dummy gate layer 62 may be a conductive or non-conductive material and may be selected from a group including amorphous silicon, polycrystalline-silicon (polysilicon), poly-crystalline silicon-germanium (poly-SiGe), metallic nitrides, metallic silicides, metallic oxides, and metals. The dummy gate layer 62 may be deposited by physical vapor deposition (PVD), CVD, sputter deposition, or other techniques for depositing the selected material. The dummy gate layer 62 may be made of other materials that have a high etching selectivity from the etching of isolation regions, e.g., the isolation regions 56 and/or the dummy dielectric layer 60. The mask layer 64 may include one or more layers of, for example, silicon nitride, silicon oxynitride, or the like. In this example, a single dummy gate layer 62 and a single mask layer 64 are formed across the n-type region 50N and the p-type region 50P. In embodiments in which the dummy dielectric layer 60 covers the isolation regions 56, the dummy dielectric layer 60 may extend over the isolation regions 56 and between the dummy gate layer 62 and the isolation regions 56.

FIGS. 20A through 29D illustrate various additional steps in the manufacturing of embodiment devices. FIGS. 20A through 29D illustrate features in either of the n-type region 50N and the p-type region 50P. For example, the structures illustrated in FIGS. 20A through 29D may be applicable to both the n-type region 50N and the p-type region 50P. Differences (if any) in the structures of the n-type region 50N and the p-type region 50P are described in the text accompanying each figure.

Figure 20A:
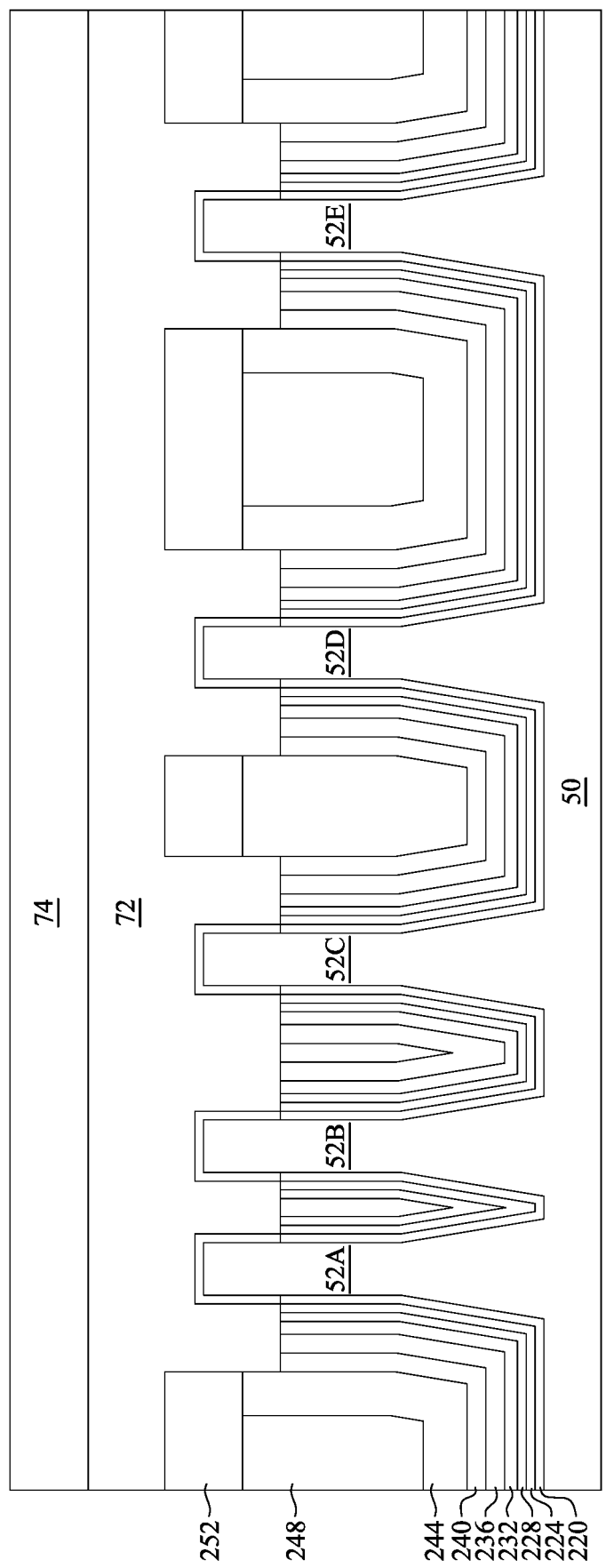
Figure 20B:
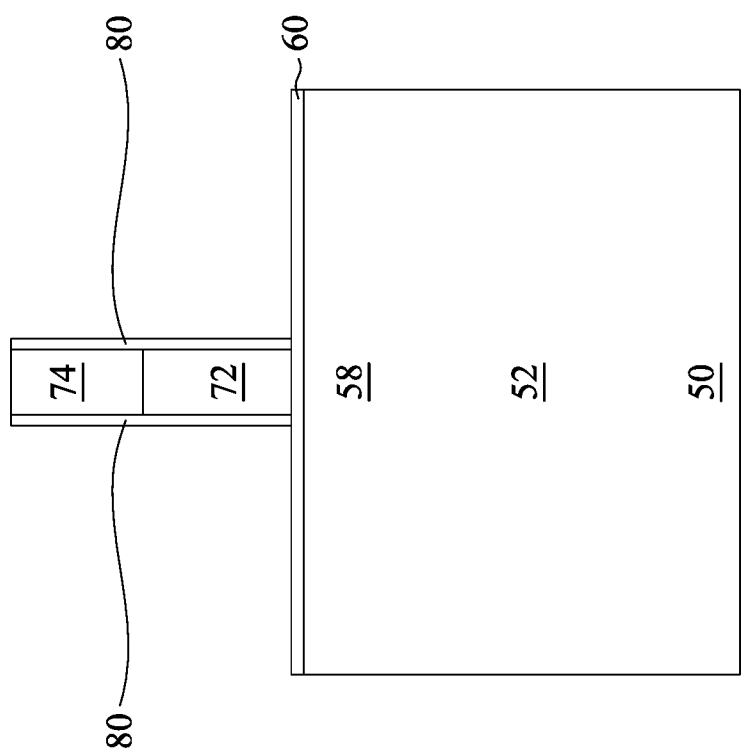

In FIGS. 20A and 20B, the mask layer 64 (see FIG. 19) may be patterned using acceptable photolithography and etching techniques to form masks 74. The pattern of the masks 74 may then be transferred to the dummy gate layer 62. In some embodiments (not illustrated), the pattern of the masks 74 may also be transferred to the dummy dielectric layer 60 by an acceptable etching technique to form dummy gates 72. The dummy gates 72 cover respective channel regions 58 of the fins 52. The pattern of the masks 74 may be used to physically separate each of the dummy gates 72 from adjacent dummy gates. The dummy gates 72 may also have a lengthwise direction substantially perpendicular to the lengthwise direction of respective epitaxial fins 52.

Further in FIGS. 20A and 20B, gate seal spacers 80 can be formed on exposed surfaces of the dummy gates 72, the masks 74, and/or the fins 52. A thermal oxidation or a deposition followed by an anisotropic etch may form the gate seal spacers 80. The gate seal spacers 80 may be formed of silicon oxide, silicon nitride, silicon oxynitride, or the like.

After the formation of the gate seal spacers 80, implants for lightly doped source/drain (LDD) regions (not explicitly illustrated) may be performed. In the embodiments with different device types, similar to the implants discussed above in FIG. 19, a mask, such as a photoresist, may be formed over the n-type region 50N, while exposing the p-type region 50P, and appropriate type (e.g., p-type) impurities may be implanted into the exposed fins 52 in the p-type region 50P. The mask may then be removed. Subsequently, a mask, such as a photoresist, may be formed over the p-type region 50P while exposing the n-type region 50N, and appropriate type impurities (e.g., n-type) may be implanted into the exposed fins 52 in the n-type region 50N. The mask may then be removed. The n-type impurities may be the any of the n-type impurities previously discussed, and the p-type impurities may be the any of the p-type impurities previously discussed. The lightly doped source/drain regions may have a concentration of impurities of from about $10^{15}$ cm$^{-3}$ to about $10^{19}$ cm$^{-3}$. An anneal may be used to repair implant damage and to activate the implanted impurities.

Figure 21A:
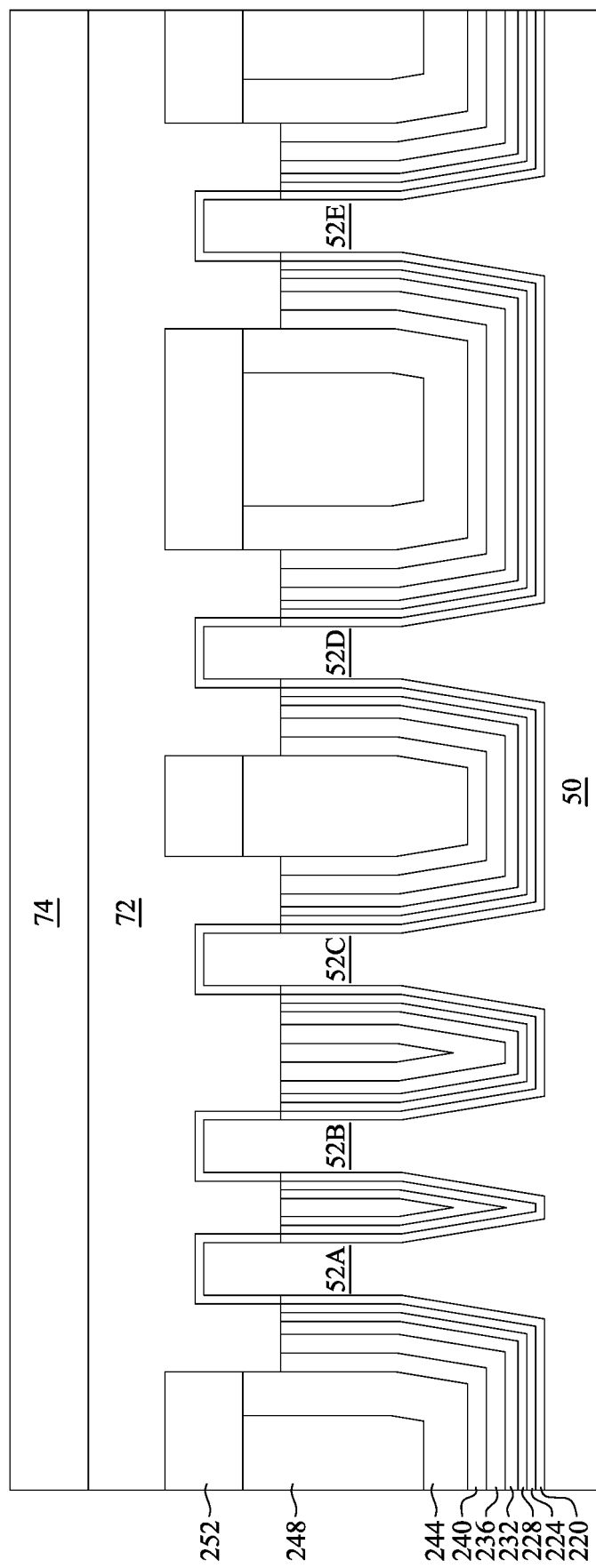
Figure 21B:
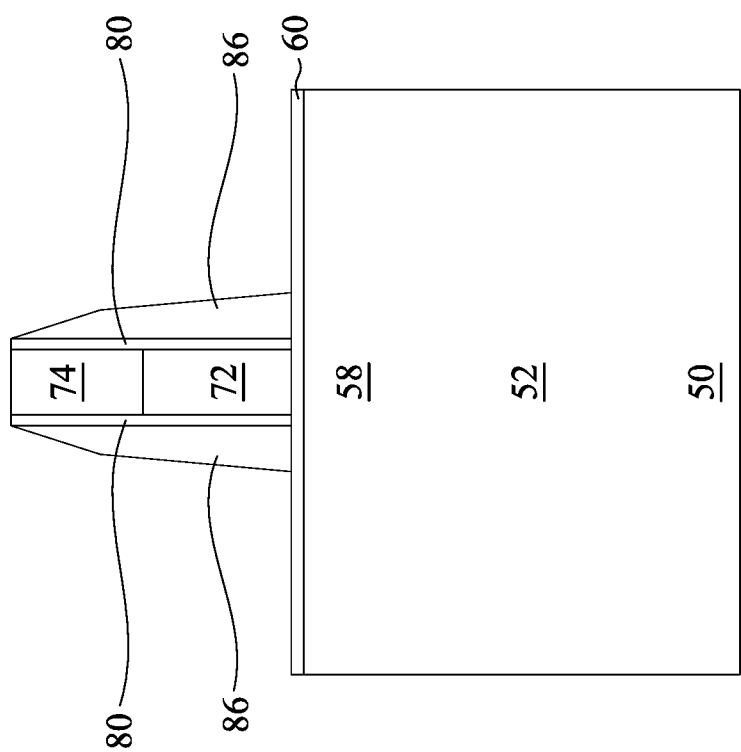

In FIGS. 21A and 21B, gate spacers 86 are formed on the gate seal spacers 80 along sidewalls of the dummy gates 72 and the masks 74. The gate spacers 86 may be formed by conformally depositing an insulating material and subsequently anisotropically etching the insulating material. The insulating material of the gate spacers 86 may be silicon oxide, silicon nitride, silicon oxynitride, silicon carbonitride, a combination thereof, or the like.

It is noted that the above disclosure generally describes a process of forming spacers and LDD regions. Other processes and sequences may be used. For example, fewer or additional spacers may be utilized, different sequence of steps may be utilized (e.g., the gate seal spacers 80 may not be etched prior to forming the gate spacers 86, yielding "L-shaped" gate seal spacers, spacers may be formed and removed, and/or the like. Furthermore, the n-type and p-type devices may be formed using a different structures and steps. For example, LDD regions for n-type devices may be formed prior to forming the gate seal spacers 80 while the LDD regions for p-type devices may be formed after forming the gate seal spacers 80.

Figure 22A:
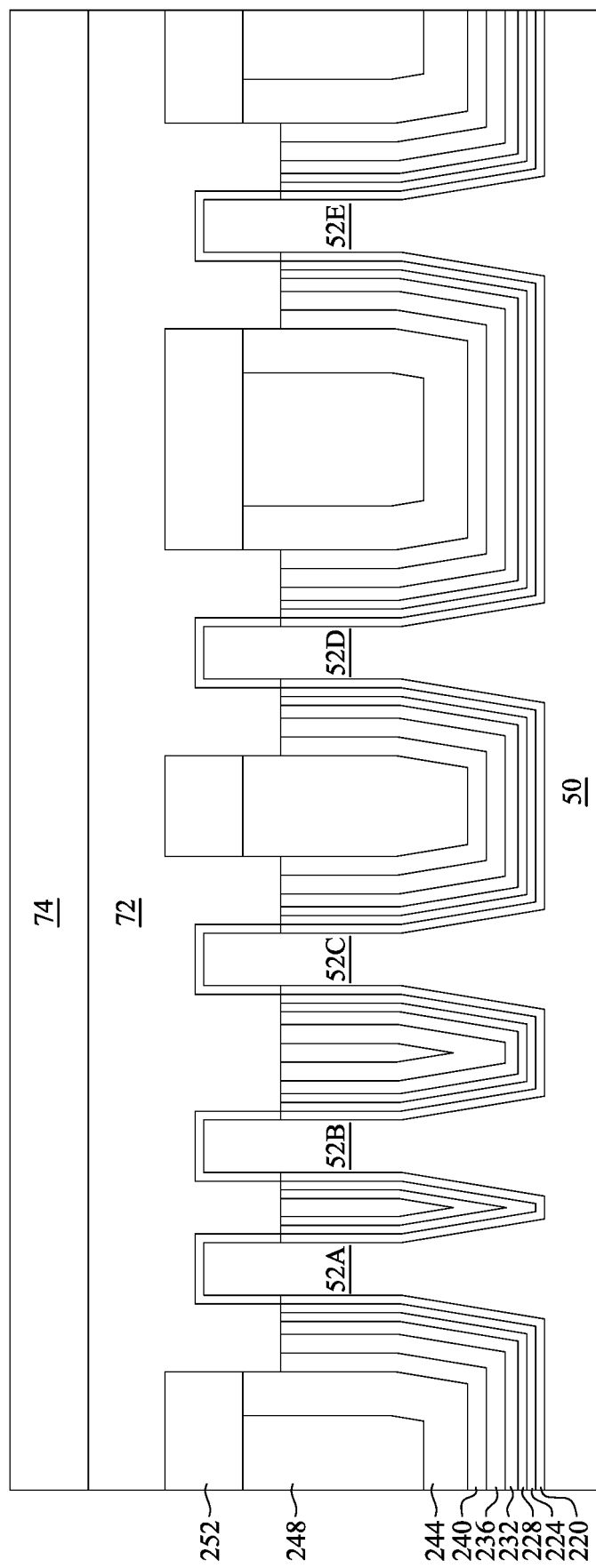
Figure 22B:
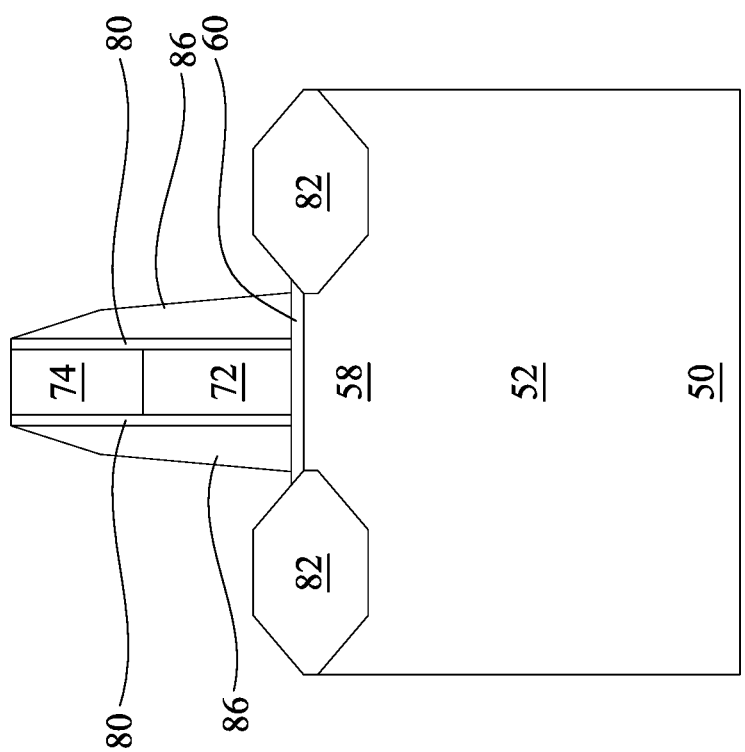
Figure 22C:
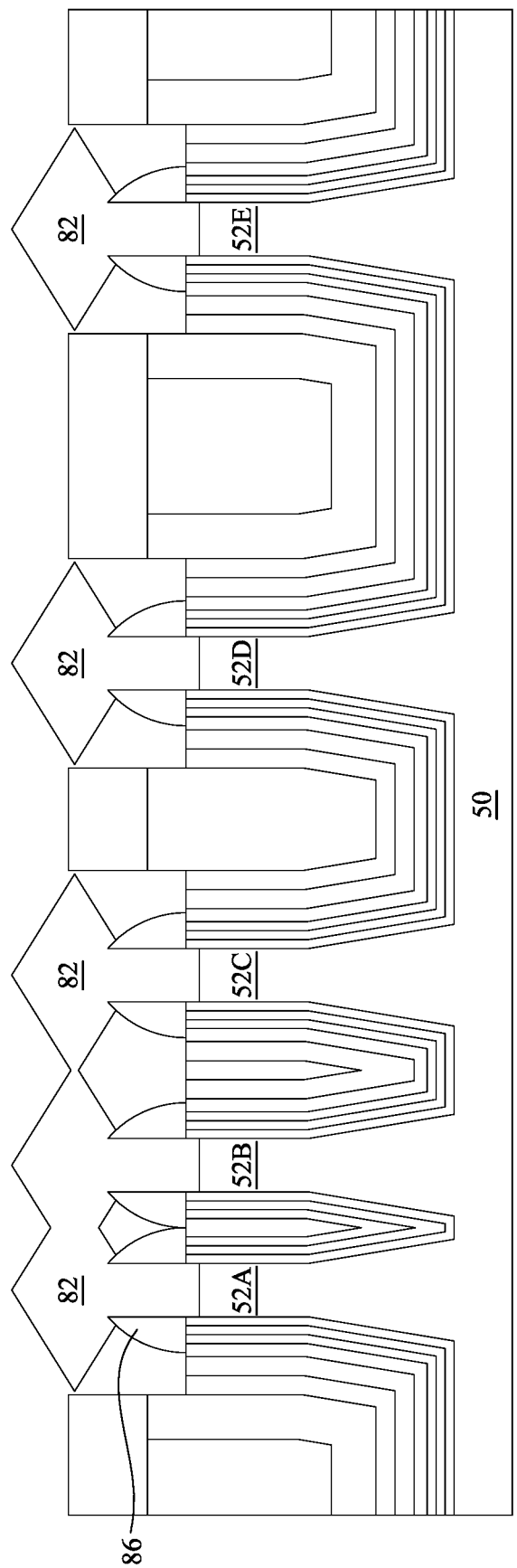
Figure 22D:
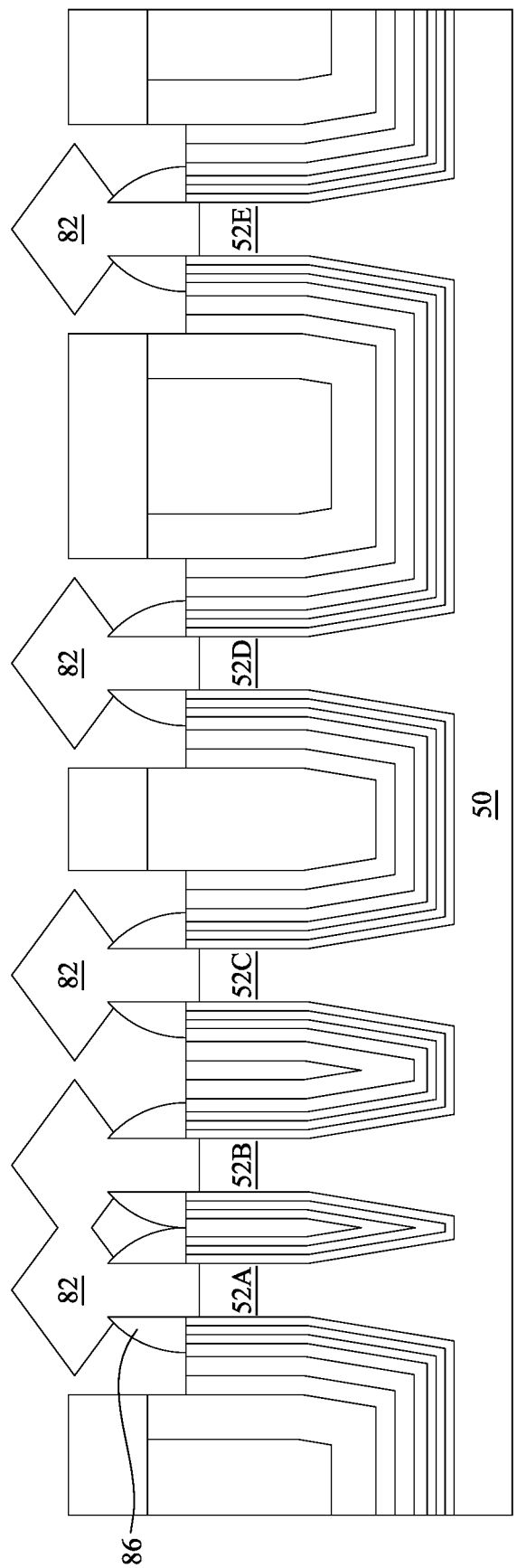

In FIGS. 22A and 22B epitaxial source/drain regions 82 are formed in the fins 52. The epitaxial source/drain regions 82 are formed in the fins 52 such that each dummy gate 72 is disposed between respective neighboring pairs of the epitaxial source/drain regions 82. In some embodiments the epitaxial source/drain regions 82 may extend into, and may also penetrate through, the fins 52. In some embodiments, the gate spacers 86 are used to separate the epitaxial source/drain regions 82 from the dummy gates 72 by an appropriate lateral distance so that the epitaxial source/drain regions 82 do not short out subsequently formed gates of the resulting FinFETs. A material of the epitaxial source/drain regions 82 may be selected to exert stress in the respective channel regions 58, thereby improving performance.

The epitaxial source/drain regions 82 in the n-type region 50N may be formed by masking the p-type region 50P and etching source/drain regions of the fins 52 in the n-type region 50N to form recesses in the fins 52. Then, the epitaxial source/drain regions 82 in the n-type region 50N are epitaxially grown in the recesses. The epitaxial source/drain regions 82 may include any acceptable material, such as appropriate for n-type FinFETs. For example, if the fin 52 is silicon, the epitaxial source/drain regions 82 in the n-type region 50N may include materials exerting a tensile strain in the channel region 58, such as silicon, silicon carbide, phosphorous doped silicon carbide, silicon phosphide, or the like. The epitaxial source/drain regions 82 in the n-type region 50N may have surfaces raised from respective surfaces of the fins 52 and may have facets.

The epitaxial source/drain regions 82 in the p-type region 50P may be formed by masking the n-type region 50N and etching source/drain regions of the fins 52 in the p-type region 50P to form recesses in the fins 52. Then, the epitaxial source/drain regions 82 in the p-type region 50P are epitaxially grown in the recesses. The epitaxial source/drain regions 82 may include any acceptable material, such as appropriate for p-type FinFETs. For example, if the fin 52 is silicon, the epitaxial source/drain regions 82 in the p-type region 50P may comprise materials exerting a compressive strain in the channel region 58, such as silicon-germanium, boron doped silicon-germanium, germanium, germanium tin, or the like. The epitaxial source/drain regions 82 in the p-type region 50P may have surfaces raised from respective surfaces of the fins 52 and may have facets.

The epitaxial source/drain regions 82 and/or the fins 52 may be implanted with dopants to form source/drain regions, similar to the process previously discussed for forming lightly-doped source/drain regions, followed by an anneal. The source/drain regions may have an impurity concentration of between about $10^{19}$ cm$^{-3}$ and about $10^{21}$ cm$^{-3}$. The n-type and/or p-type impurities for source/drain regions may be any of the impurities previously discussed. In some embodiments, the epitaxial source/drain regions 82 may be in situ doped during growth.

As a result of the epitaxy processes used to form the epitaxial source/drain regions 82 in the n-type region 50N and the p-type region 50P, upper surfaces of the epitaxial source/drain regions have facets which expand laterally outward beyond sidewalls of the fins 52. In some embodiments, these facets cause adjacent source/drain regions 82 of a same FinFET to merge as illustrated by FIG. 22C, such as in regard to the first fin 52A, the second fin 52B, and the third fin 52C. In other embodiments, adjacent source/drain regions 82 remain separated after the epitaxy process is completed as illustrated by FIG. 22D, such as in regard to the second fin 52B and the third fin 52C. In the embodiments illustrated in FIGS. 22C and 22D, gate spacers 86 are formed covering a portion of the sidewalls of the fins 52 that extend above the isolation regions 56 thereby blocking the epitaxial growth. In some other embodiments, the spacer etch used to form the gate spacers 86 may be adjusted to remove the spacer material to allow the epitaxially grown region to extend to the surface of the isolation region 56.

Figure 23A:
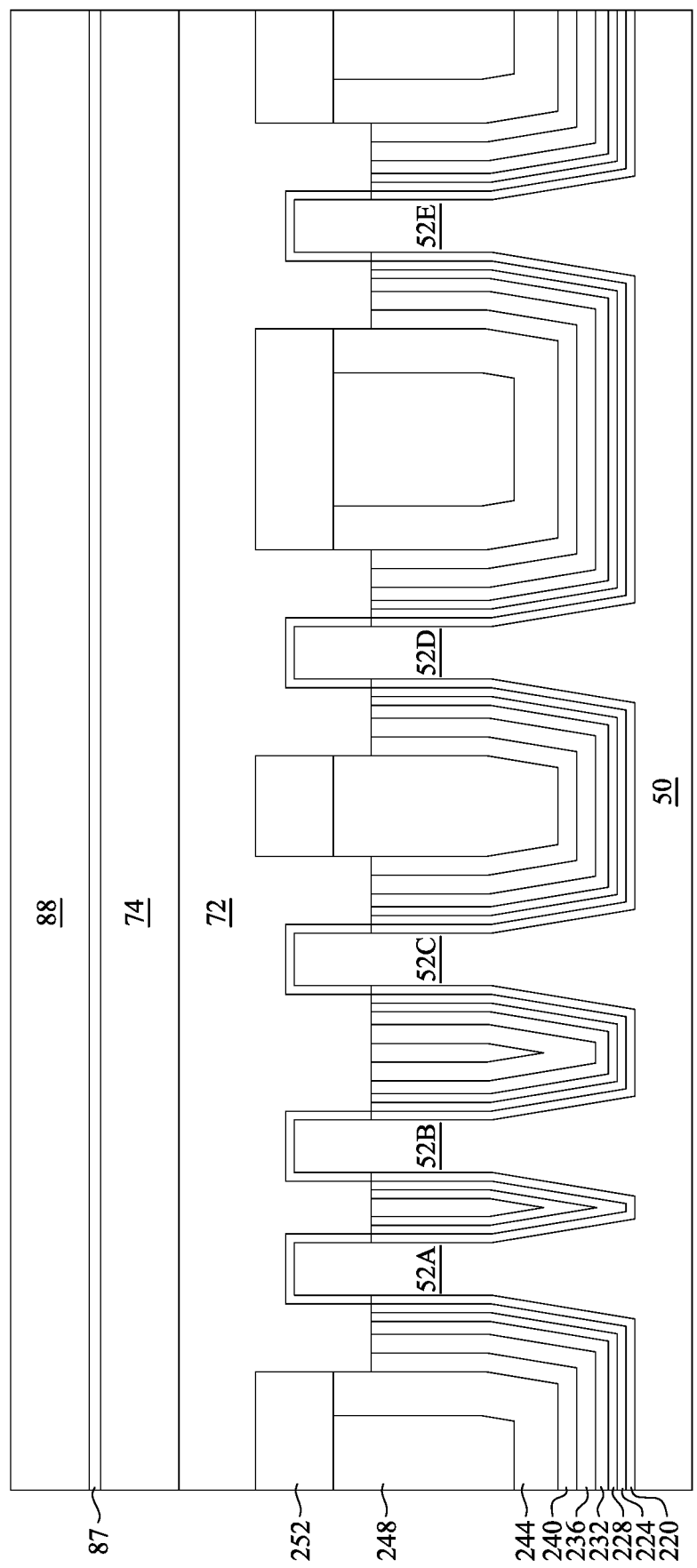
Figure 23B:
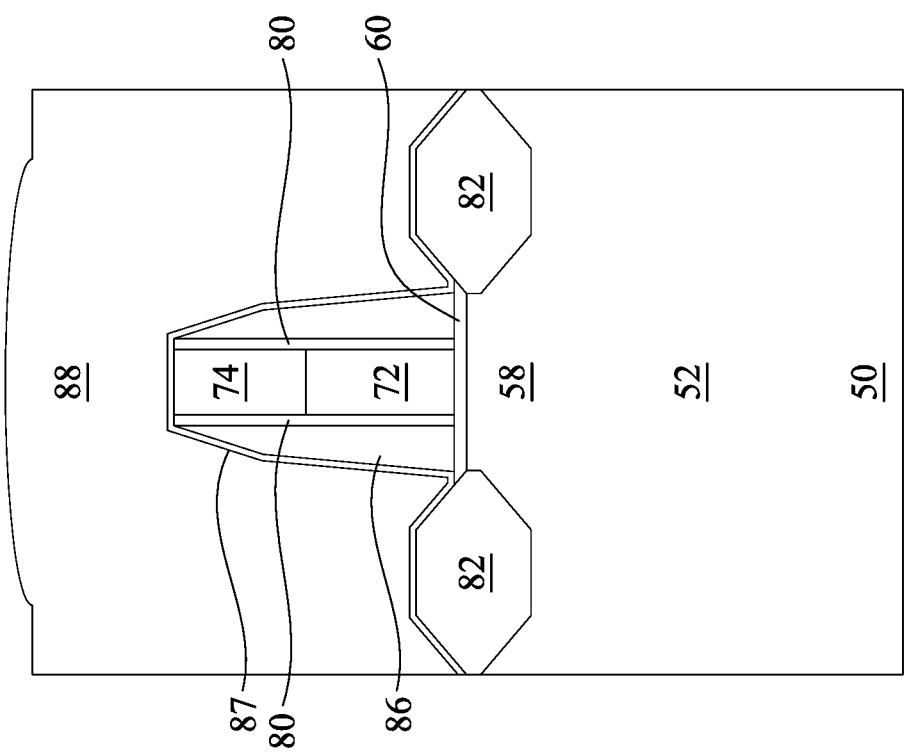

In FIGS. 23A and 23B, a first interlayer dielectric (ILD) 88 is deposited over the structure illustrated in FIGS. 22A and 22B. The first ILD 88 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. In some embodiments, a contact etch stop layer (CESL) 87 is disposed between the first ILD 88 and the epitaxial source/drain regions 82, the masks 74, and the gate spacers 86. The CESL 87 may comprise a dielectric material, such as, silicon nitride, silicon oxide, silicon oxynitride, or the like, having a lower etch rate than the material of the overlying first ILD 88.

Figure 24A:
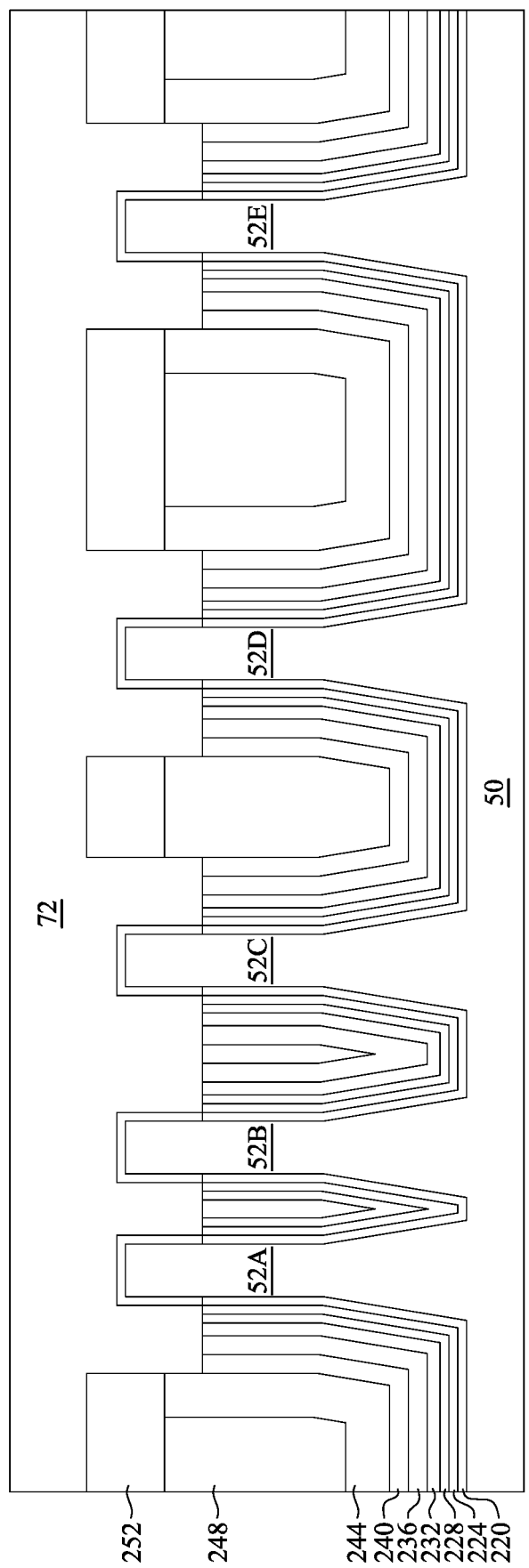
Figure 24B:
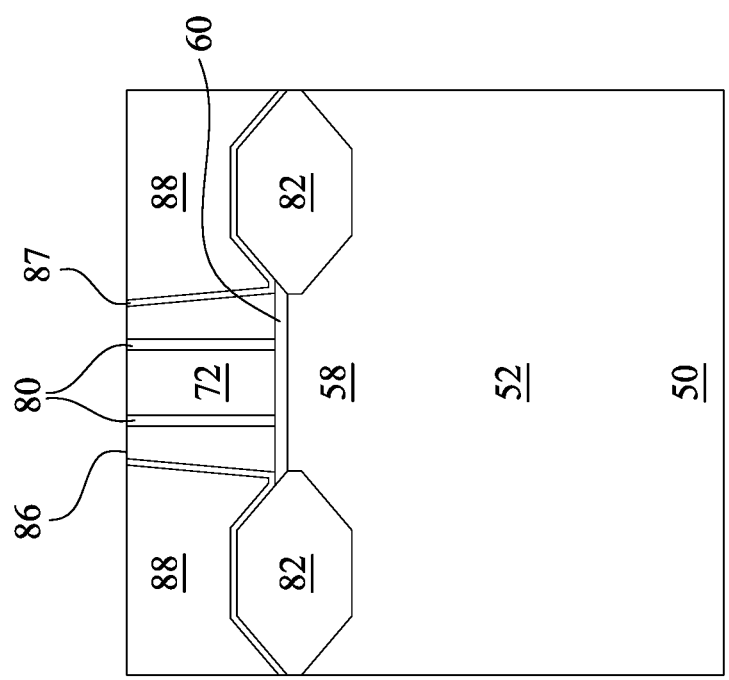

In FIGS. 24A and 24B, a planarization process, such as a CMP, may be performed to level the top surface of the first ILD 88 with the top surfaces of the dummy gates 72 or the masks 74. The planarization process may also remove the masks 74 on the dummy gates 72, and portions of the gate seal spacers 80 and the gate spacers 86 along sidewalls of the masks 74. After the planarization process, top surfaces of the dummy gates 72, the gate seal spacers 80, the gate spacers 86, and the first ILD 88 are level. Accordingly, the top surfaces of the dummy gates 72 are exposed through the first ILD 88. In some embodiments, the masks 74 may remain, in which case the planarization process levels the top surface of the first ILD 88 with the top surfaces of the top surface of the masks 74.

Figure 25A:
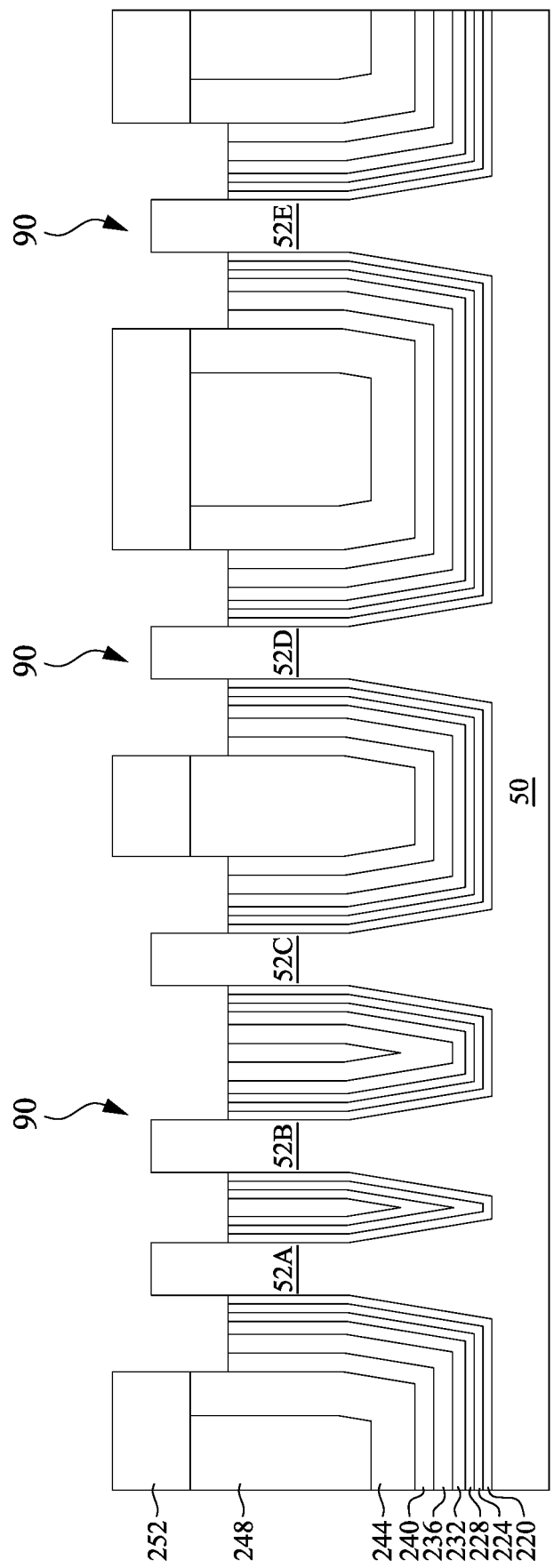
Figure 25B:
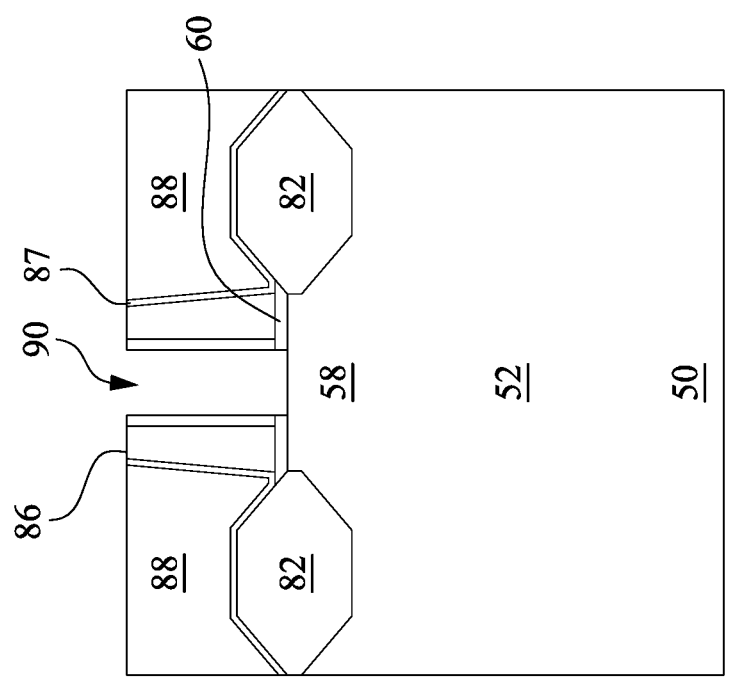

In FIGS. 25A and 25B, the dummy gates 72, and the masks 74 if present, are removed in an etching step(s), so that recesses 90 are formed. Portions of the dummy dielectric layer 60 in the recesses 90 may also be removed. In some embodiments, only the dummy gates 72 are removed and the dummy dielectric layer 60 remains and is exposed by the recesses 90. In some embodiments, the dummy dielectric layer 60 is removed from recesses 90 in a first region of a die (e.g., a core logic region) and remains in recesses 90 in a second region of the die (e.g., an input/output region). In some embodiments, the dummy gates 72 are removed by an anisotropic dry etch process. For example, the etching process may include a dry etch process using reaction gas(es) that selectively etch the dummy gates 72 with little or no etching of the first ILD 88 or the gate spacers 86. Each recess 90 exposes and/or overlies a channel region 58 of a respective fin 52. Each channel region 58 is disposed between neighboring pairs of the epitaxial source/drain regions 82. During the removal, the dummy dielectric layer 60 may be used as an etch stop layer when the dummy gates 72 are etched. The dummy dielectric layer 60 may then be optionally removed after the removal of the dummy gates 72.

Figure 26A:
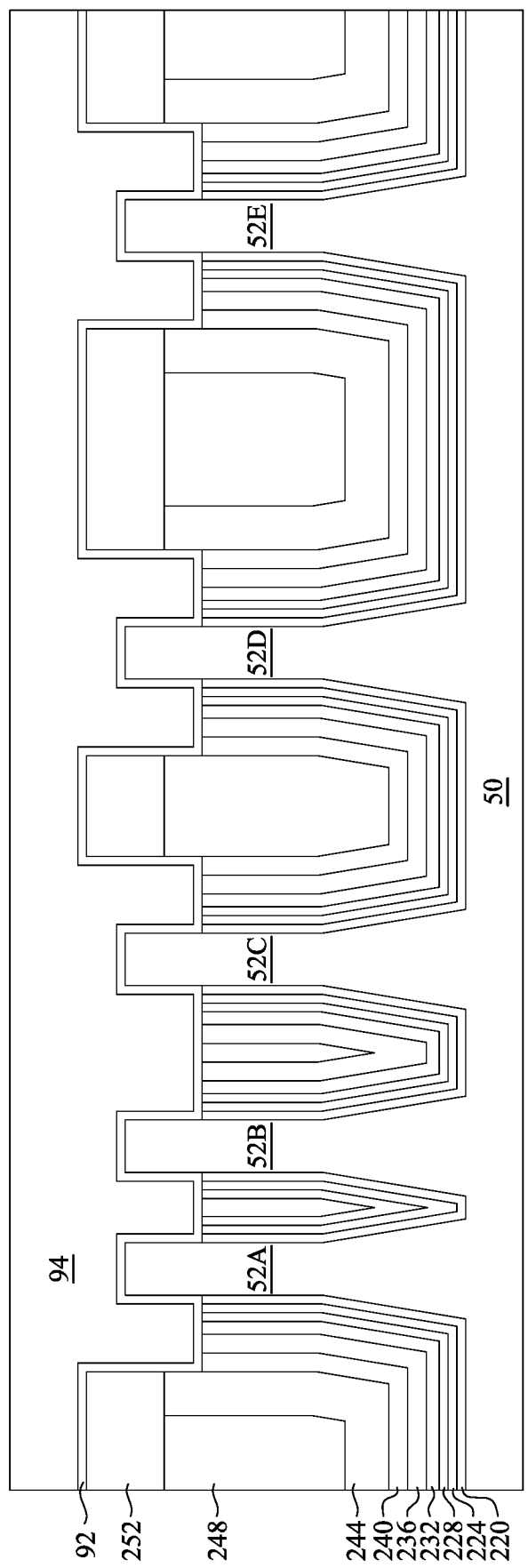
Figure 26C:
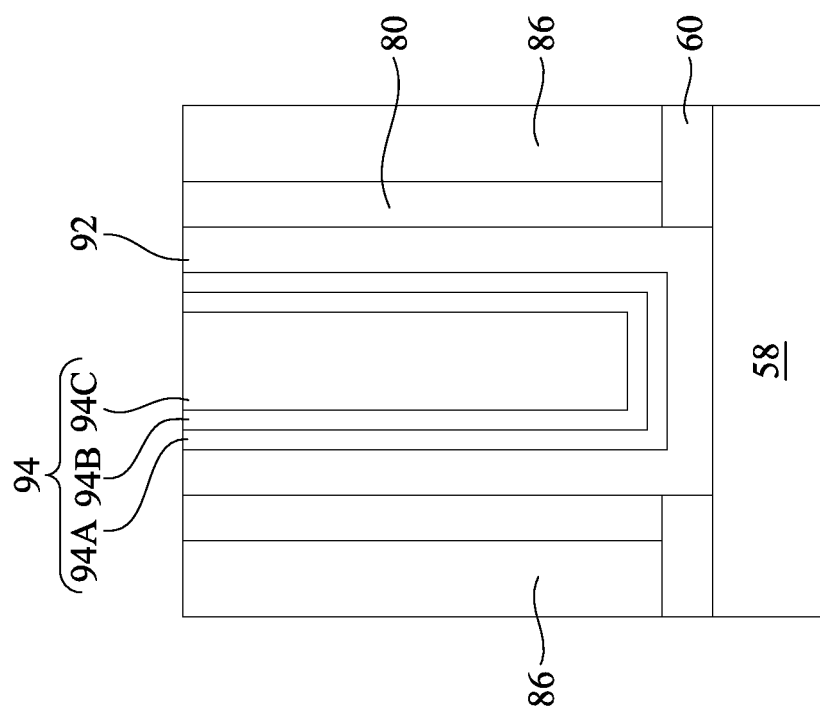

In FIGS. 26A and 26B, gate dielectric layers 92 and gate electrodes 94 are formed for replacement gates. FIG. 26C illustrates a detailed view of region 89 of FIG. 26B. As a reminder, although the fins 52 are illustrated as being adjacent to one another, each pair of the fins 52 may be located on different parts of the substrate 50. As such, all of the fins 52 would not necessarily share the same gate electrode 94. Instead, only particular groupings of the fins 52 may be controlled by the same gate electrode 94 (e.g., see FIGS. 29A-D). Gate dielectric layers 92 may include one or more layers deposited in the recesses 90, such as on the top surfaces and the sidewalls of the fins 52 and on sidewalls of the gate seal spacers 80/gate spacers 86. The gate dielectric layers 92 may also be formed on the top surface of the first ILD 88. In some embodiments, the gate dielectric layers 92 may form over the isolation regions 56 and sidewalls and upper surfaces of the first dummy fin 266 and the second dummy fin 268. In some embodiments, the gate dielectric layers 92 comprise one or more dielectric layers, such as one or more layers of silicon oxide, silicon nitride, metal oxide, metal silicate, or the like. For example, in some embodiments, the gate dielectric layers 92 include an interfacial layer of silicon oxide formed by thermal or chemical oxidation and an overlying high-k dielectric material, such as a metal oxide or a silicate of hafnium, aluminum, zirconium, lanthanum, manganese, barium, titanium, lead, and combinations thereof. The gate dielectric layers 92 may include a dielectric layer having a k value greater than about 7.0. The formation methods of the gate dielectric layers 92 may include Molecular-Beam Deposition (MBD), ALD, PECVD, and the like. In embodiments where portions of the dummy dielectric layer 60 remains in the recesses 90, the gate dielectric layers 92 include a material of the dummy dielectric layer 60 (e.g., $SiO_2$).

The gate electrodes 94 are deposited over the gate dielectric layers 92, respectively, and fill the remaining portions of the recesses 90. The gate electrodes 94 may include a metal-containing material such as titanium nitride, titanium oxide, tantalum nitride, tantalum carbide, cobalt, ruthenium, aluminum, tungsten, combinations thereof, or multi-layers thereof. For example, although a single layer gate electrode 94 is illustrated in FIG. 26B, the gate electrode 94 may comprise any number of liner layers 94A, any number of work function tuning layers 94B, and a fill material 94C as illustrated by FIG. 26C. After the filling of the recesses 90, a planarization process, such as a CMP, may be performed to remove the excess portions of the gate dielectric layers 92 and the material of the gate electrodes 94, which excess portions are over the top surface of the first ILD 88. The remaining portions of material of the gate electrodes 94 and the gate dielectric layers 92 thus form replacement gates of the resulting FinFETs. The gate electrodes 94 and the gate dielectric layers 92 may be collectively referred to as a "gate stack." The gate and the gate stacks may extend along sidewalls of a channel region 58 of the fins 52.

The formation of the gate dielectric layers 92 in the n-type region 50N and the p-type region 50P may occur simultaneously such that the gate dielectric layers 92 in each region are formed from the same materials, and the formation of the gate electrodes 94 may occur simultaneously such that the gate electrodes 94 in each region are formed from the same materials. In some embodiments, the gate dielectric layers 92 in each region may be formed by distinct processes, such that the gate dielectric layers 92 may be different materials, and/or the gate electrodes 94 in each region may be formed by distinct processes, such that the gate electrodes 94 may be different materials. Various masking steps may be used to mask and expose appropriate regions when using distinct processes.

Figure 27A:
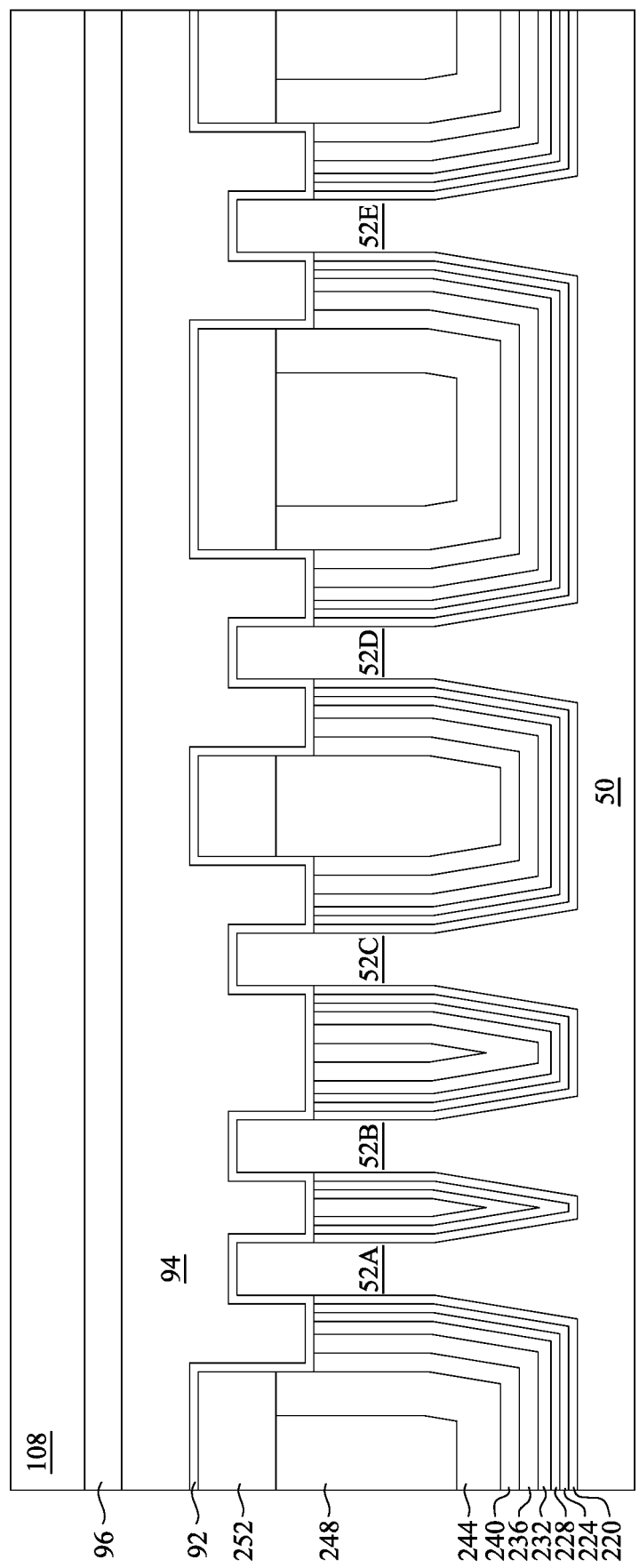
Figure 27B:
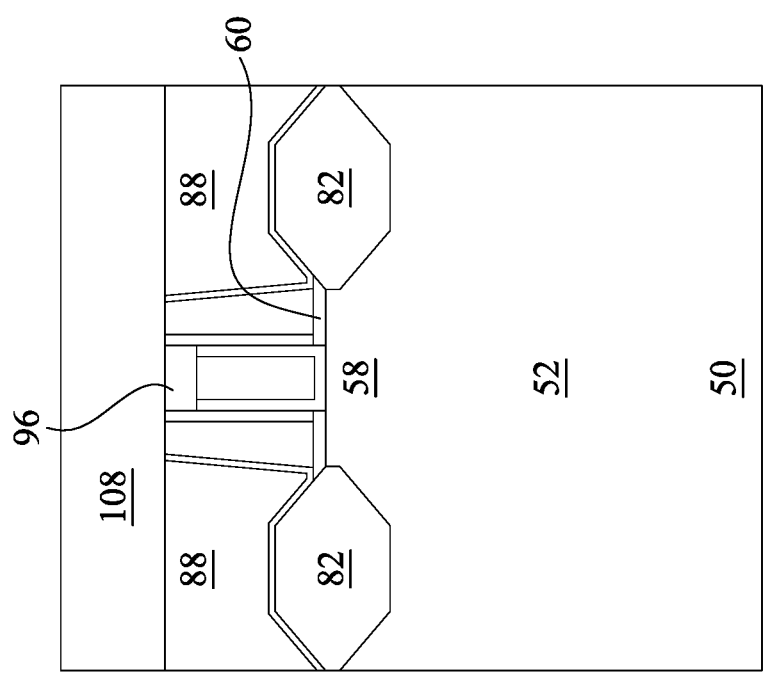

In FIGS. 27A and 27B, a gate mask 96 is formed over the gate stack (including a gate dielectric layer 92 and a corresponding gate electrode 94), and the gate mask may be disposed between opposing portions of the gate spacers 86. In some embodiments, forming the gate mask 96 includes recessing the gate stack so that a recess is formed directly over the gate stack and between opposing portions of gate spacers 86. A gate mask 96 comprising one or more layers of dielectric material, such as silicon nitride, silicon oxynitride, or the like, is filled in the recess, followed by a planarization process to remove excess portions of the dielectric material extending over the first ILD 88.

As also illustrated in FIGS. 27A and 27B, a second ILD 108 is deposited over the first ILD 88. In some embodiments, the second ILD 108 is a flowable film formed by a flowable CVD method. In some embodiments, the second ILD 108 is formed of a dielectric material such as PSG, BSG, BPSG, USG, or the like, and may be deposited by any suitable method, such as CVD and PECVD. The subsequently formed gate contacts 110 (FIGS. 28A and 28B) penetrate through the second ILD 108 and the gate mask 96 to contact the top surface of the recessed gate electrode 94.

Figure 28A:
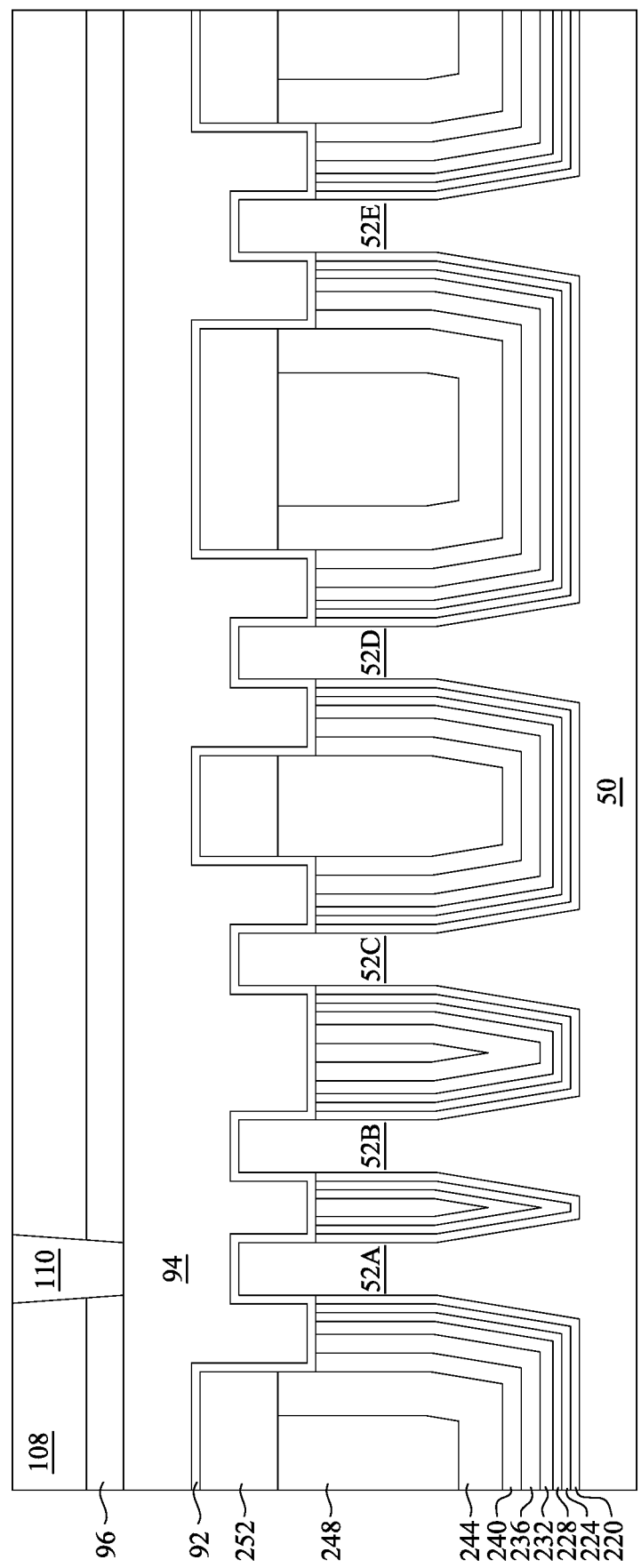
Figure 28B:
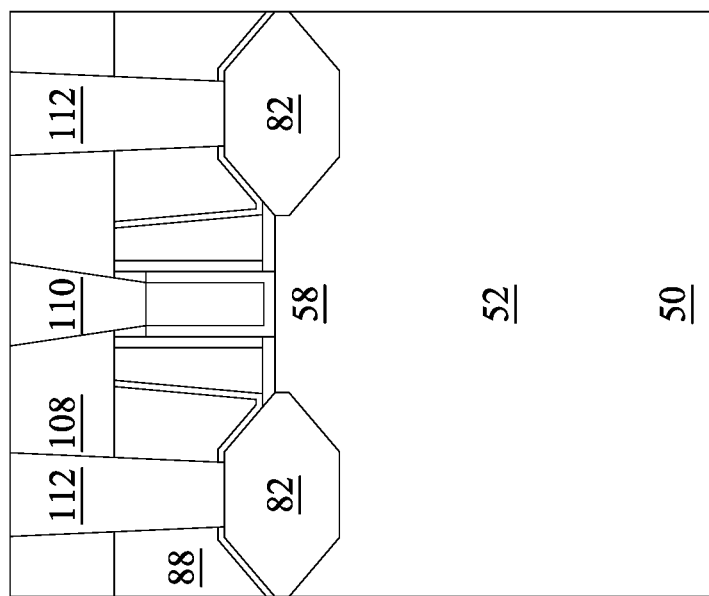

In FIGS. 28A and 28B, gate contacts 110 and source/drain contacts 112 are formed through the second ILD 108 and the first ILD 88 in accordance with some embodiments. Openings for the source/drain contacts 112 are formed through the first and second ILDs 88 and 108, and openings for the gate contact 110 are formed through the second ILD 108 and the gate mask 96. The openings may be formed using acceptable photolithography and etching techniques. A liner (not shown), such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the second ILD 108. The remaining liner and conductive material form the source/drain contacts 112 and gate contacts 110 in the openings. An anneal process may be performed to form a silicide at the interface between the epitaxial source/drain regions 82 and the source/drain contacts 112. The source/drain contacts 112 are physically and electrically coupled to the epitaxial source/drain regions 82, and the gate contacts 110 are physically and electrically coupled to the gate electrodes 106. The source/drain contacts 112 and gate contacts 110 may be formed in different processes, or may be formed in the same process. Although shown as being formed in the same cross-sections, it should be appreciated that each of the source/drain contacts 112 and gate contacts 110 may be formed in different cross-sections, which may avoid shorting of the contacts.

Figure 29B:
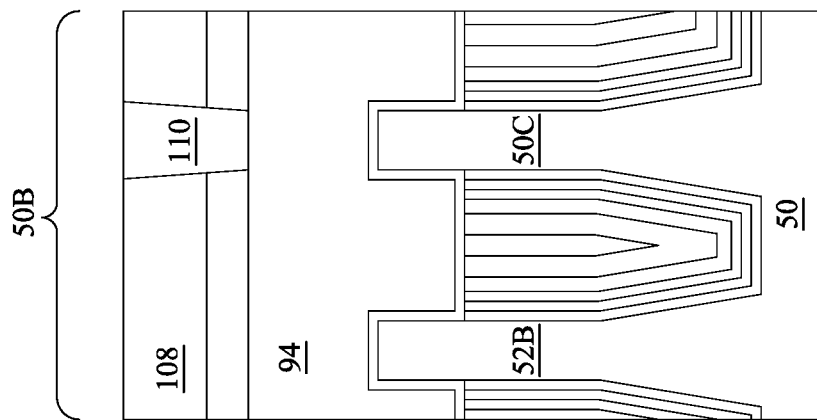
Figure 29A:
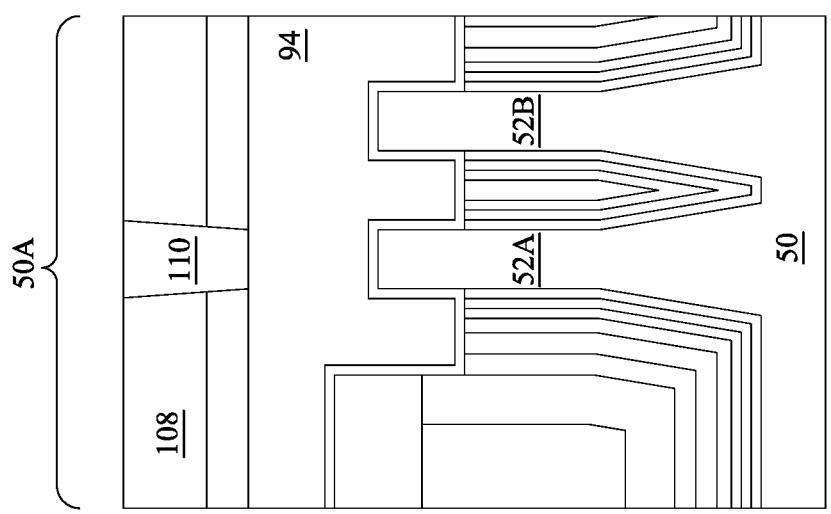
Figure 29D:
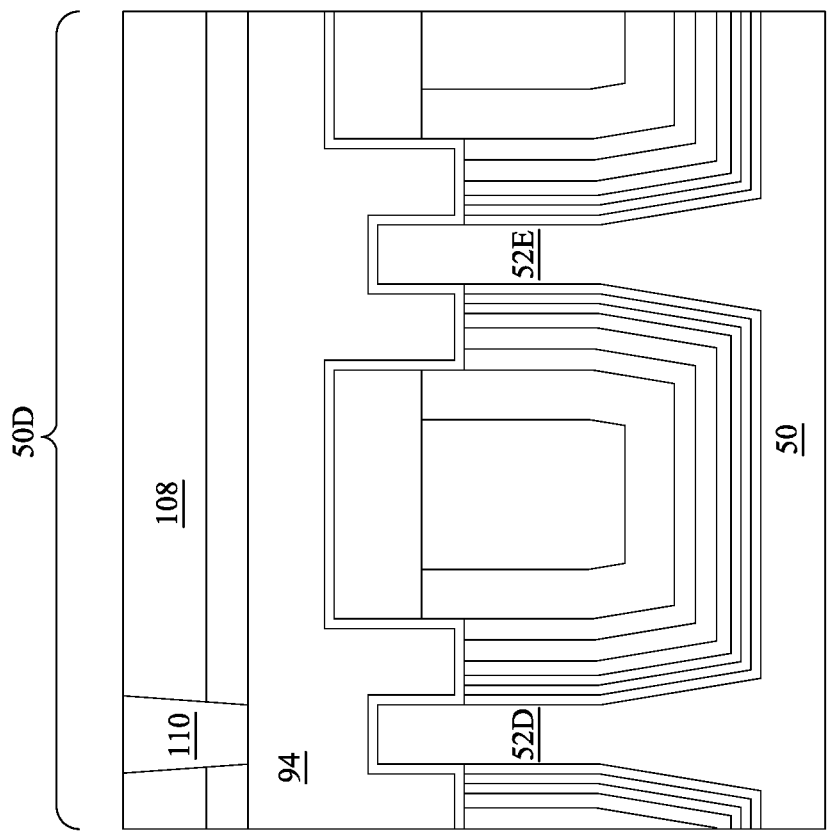
Figure 29C:
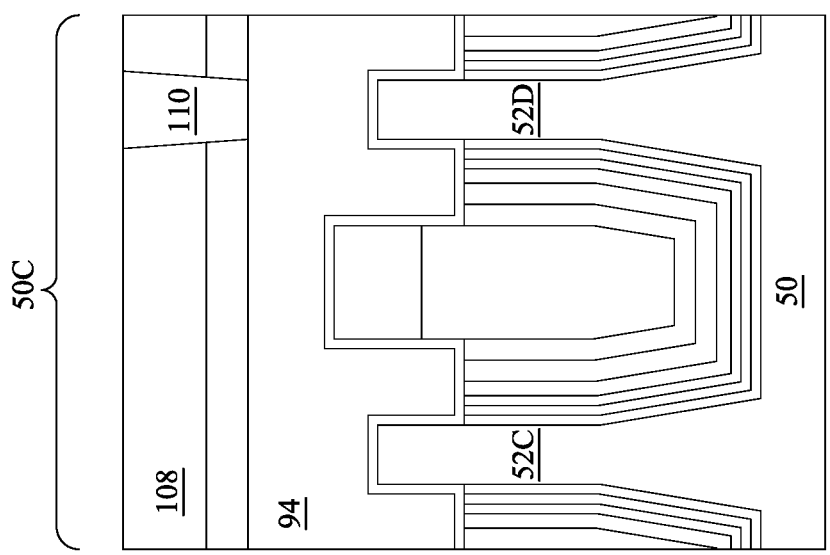

In FIGS. 29A through 29D, each pairing of the fins 52 is illustrated separately as shown in their respective regions (e.g., the first region 50A, the second region 50B, the third region 50C, and the fourth region 50D). FIG. 29A illustrates representatives of the first fin 52A and the second fin 52B in the first region 50A. FIG. 29B illustrates representatives of the second fin 52B and the third fin 52C in the second region 50B. FIG. 29C illustrates representatives of the third fin 52C and the fourth fin 52D in the third region 50C. FIG. 29D illustrates representatives of the fourth fin 52D and the fifth fin 52E in the fourth region 50D. As discussed above, any of these regions may be adjacent, nearby, or distant from one another on the die. For example, in some embodiments, the second fin 52B in the first region 50A may be the same second fin 52B in the second region 50B. An analogous arrangement may be the case for the third fin 52C and/or the fourth fin 52D as well.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

The disclosed FinFET embodiments could also be applied to nanostructure devices such as nanostructure (e.g., nanosheet, nanowire, gate-all-around, or the like) field effect transistors (NSFETs). In an NSFET embodiment, the fins are replaced by nanostructures formed by patterning a stack of alternating layers of channel layers and sacrificial layers. Dummy gate stacks and source/drain regions are formed in a manner similar to the above-described embodiments. After the dummy gate stacks are removed, the sacrificial layers can be partially or fully removed in channel regions. The replacement gate structures are formed in a manner similar to the above-described embodiments, the replacement gate structures may partially or completely fill openings left by removing the sacrificial layers, and the replacement gate structures may partially or completely surround the channel layers in the channel regions of the NSFET devices. ILDs and contacts to the replacement gate structures and the source/drain regions may be formed in a manner similar to the above-described embodiments.

Embodiments may achieve advantages. As semiconductor devices continue to get smaller, the semiconductor fins 52 tend to become narrower. As a result, the fins 52 are increasingly susceptible to bending and strain caused by stresses from nearby layers. A particular method of ordering and forming certain nearby layers may be used to prevent or reduce these effects on the fins 52. For example, the fourth dielectric layer 236 may serve to protect the fins 52 from an overlying layer, such as the fifth dielectric layer 240. Although some bending or strain may still occur in the fins 52 due to the overlying layer(s), the disclosed method provides an important reduction so that purposeful strains may be imparted on the fins 52 through more controlled means, if desired. In addition to improved performance and robustness of the semiconductor device, higher manufacturing yield and efficiency can be expected from the improved process design.

In an embodiment, a method includes forming a plurality of semiconductor fins over a substrate, the plurality of semiconductor fins comprising a first fin, a second fin, a third fin, and a fourth fin; forming a first dielectric layer over the plurality of semiconductor fins, the first dielectric layer filling an entirety of a first trench between the first fin and the second fin; forming a second dielectric layer over the first dielectric layer, the second dielectric layer filling an entirety of a second trench between the second fin and the third fin, the forming the second dielectric layer comprising: forming an oxynitride layer; and forming an oxide layer; and forming a third dielectric layer over the second dielectric layer, the third dielectric layer filling an entirety of a third trench between the third fin and the fourth fin. In another embodiment, depositing the second dielectric layer further comprises performing a plasma or gas treatment to convert an upper region of the first dielectric layer to the oxynitride layer. In another embodiment, the oxynitride layer comprises a porosity of between about 30% and about 60%. In another embodiment, forming the oxynitride layer comprises modifying a stress in the plurality of the semiconductor fins, and wherein the oxynitride layer comprises a thickness of between about 10 Å and about 70 Å. In another embodiment, forming the second dielectric layer further comprises performing a second anneal treatment on the oxynitride layer, the second anneal treatment at least partially oxidizing the oxynitride layer, wherein the second anneal treatment comprises temperatures between about 400° C. and about 800° C. and pressures between about 100 Pascal and about 1200 Pascal. In another embodiment, the second anneal treatment comprises a plasma process performed at a power of between about 100 W and about 900 W. In another embodiment, the method further includes forming a first dummy fin, the forming the first dummy fin comprising: etching a portion of the third dielectric layer; forming a helmet layer over the third dielectric layer; and recessing the first dielectric layer, the second dielectric layer, and the third dielectric layer so that the helmet layer protrudes above the first dielectric layer, the second dielectric layer, and the third dielectric layer, wherein the first dummy fin comprises the third dielectric layer and the helmet layer. In another embodiment, the plurality of semiconductor fins further comprises a fifth fin, the method further comprising forming a fourth dielectric layer, the fourth dielectric layer filling an entirety of a fourth trench between the fourth fin and the fifth fin, and wherein the method further comprises forming a second dummy fin, the forming the second dummy fin comprising, before forming the helmet layer, recessing the fourth dielectric layer, wherein the second dummy fin comprises the third dielectric layer, the fourth dielectric layer, and the helmet layer.

In an embodiment, a method includes forming a plurality of semiconductor fins over a substrate, the plurality of semiconductor fins comprising a first fin, a second fin, and a third fin, a first sidewall of the first fin facing a second sidewall of the second fin, the first sidewall laterally displaced from the second sidewall by a first distance, a third sidewall of the second fin facing a fourth sidewall of the third fin, the second sidewall laterally displaced from the fourth sidewall by a second distance; forming a first dielectric layer over the plurality of semiconductor fins; forming a second dielectric layer over the first dielectric layer; and forming a third dielectric layer over the second dielectric layer, wherein after forming the third dielectric layer, the first sidewall is laterally displaced from the second sidewall by a third distance and the third sidewall is laterally displaced from the fourth sidewall by a fourth distance, wherein the third distance is less than the first distance and at least about 95% of the first distance, and wherein the second distance is less than the fourth distance and at least about 95% of the fourth distance. In another embodiment, after forming the second dielectric layer: the first sidewall is laterally displaced from the second sidewall by the first distance; and the third sidewall is laterally displaced from the fourth sidewall by the second distance. In another embodiment, after forming the second dielectric layer and before forming the third dielectric layer: the first sidewall is laterally displaced from the second sidewall by the third distance; and the third sidewall is laterally displaced from the fourth sidewall by the fourth distance. In another embodiment, the method further includes recessing the first dielectric layer, the second dielectric layer, and the third dielectric layer to expose the plurality of semiconductor fins; forming a dummy gate structure over the plurality of semiconductor fins; etching portions of each of the plurality of semiconductor fins on opposing sides of the dummy gate structure; forming a first source/drain region over the etched first fin, a second source/drain region over the etched second fin, and a third source/drain region over the etched third fin; and replacing the dummy gate structure with a gate structure. In another embodiment, after the replacing the dummy gate structure with the gate structure, the first sidewall is laterally displaced from the second sidewall by the third distance and the third sidewall is laterally displaced from the fourth sidewall by the fourth distance. In another embodiment, the second source/drain region physically merges with the first source/drain region and with the third source/drain region. In another embodiment, the second source/drain region physically merges with the first source/drain region, and wherein the second source/drain region is laterally displaced from the third source/drain region.

In an embodiment, a semiconductor device includes a plurality of semiconductor fins disposed over a substrate, the plurality of semiconductor fins comprising: a first fin comprising a first sidewall, an upper portion of the first sidewall having a first angle from a major plane of the substrate; a second fin comprising a second sidewall and a third sidewall, the second sidewall facing the first sidewall, an upper portion of the second sidewall having a second angle from the major plane of the substrate, an upper portion of the third sidewall having a third angle from the major plane of the substrate, the third angle being greater than the first angle, a difference between the third angle and the first angle being less than about 1°; a third fin comprising a fourth sidewall and a fifth sidewall, the fourth sidewall facing the third sidewall, an upper portion of the fourth sidewall having a fourth angle from the major plane of the substrate, an upper portion of the fifth sidewall having a fifth angle from the major plane of the substrate; and a fourth fin comprising a sixth sidewall, the sixth sidewall facing the fifth sidewall, an upper portion of the sixth sidewall having a sixth angle from the major plane of the substrate; a first plurality of dielectric layers interposed between the first fin and the second fin; a second plurality of dielectric layers interposed between the second fin and the third fin, the second plurality of dielectric layers being different than the first plurality of dielectric layers; and a third plurality of dielectric layers interposed between the third fin and the fourth fin, the third plurality of dielectric layers being different than each of the first plurality of dielectric layers and the second plurality of dielectric layers. In another embodiment, the difference between the third angle and the first angle is about the same as a difference between the third angle and the second angle. In another embodiment, the second plurality of dielectric layers comprises all of the first plurality of dielectric layers and at least two additional dielectric layers. In another embodiment, the third plurality of dielectric layers comprises all of the second plurality of dielectric layers and at least one additional dielectric layer. In another embodiment, the third plurality of dielectric layers further comprises a high-k dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
    a plurality of semiconductor fins disposed over a substrate, the plurality of semiconductor fins comprising:
        a first fin comprising a first sidewall;
        a second fin comprising a second sidewall and a third sidewall, the second sidewall facing the first sidewall;
        a third fin comprising a fourth sidewall and a fifth sidewall, the fourth sidewall facing the third sidewall; and
        a fourth fin comprising a sixth sidewall, the sixth sidewall facing the fifth sidewall;
    a first plurality of dielectric layers interposed between the first fin and the second fin;
    a second plurality of dielectric layers interposed between the second fin and the third fin, the second plurality of dielectric layers being different than the first plurality of dielectric layers; and
    a third plurality of dielectric layers interposed between the third fin and the fourth fin, the third plurality of dielectric layers being different than each of the first plurality of dielectric layers and the second plurality of dielectric layers, the third plurality of dielectric layers comprising a metal oxide.

2. The semiconductor device of claim 1, wherein:
    an upper portion of the first sidewall has a first angle from a major plane of the substrate;
    an upper portion of the second sidewall has a second angle from the major plane of the substrate; and
    an upper portion of the third sidewall has a third angle from the major plane of the substrate, the third angle being greater than the first angle, a difference between the third angle and the first angle being less than about 1°.

3. The semiconductor device of claim 2, wherein the difference between the third angle and the first angle is about the same as a difference between the third angle and the second angle.

4. The semiconductor device of claim 1, wherein the second plurality of dielectric layers comprises all of the first plurality of dielectric layers and at least two additional dielectric layers.

5. The semiconductor device of claim 4, wherein the third plurality of dielectric layers comprises all of the second plurality of dielectric layers and at least one additional dielectric layer.

6. The semiconductor device of claim 1, wherein the first plurality of dielectric layers comprises:
a first oxide layer over the plurality of semiconductor fins;
a first oxycarbonitride layer over the first oxide layer; and
a second oxide layer over the first oxycarbonitride layer.

7. The semiconductor device of claim 6, wherein the second plurality of dielectric layers comprises:
a second oxycarbonitride layer over the first plurality of dielectric layers; and
a third oxide layer over the second oxycarbonitride layer.

8. The semiconductor device of claim 7, wherein the third plurality of dielectric layers comprises a carbonitride layer over the second plurality of dielectric layers.

9. A semiconductor device, comprising:
a first fin over a substrate;
a second fin over the substrate, the second fin separated from the first fin by a first distance;
a third fin over the substrate, the third fin separated from the second fin by a second distance, the second distance being greater than the first distance;
a liner layer over the first fin, the second fin, and the third fin;
a first oxide layer over the liner layer;
a first nitride layer over the first oxide layer;
a second oxide layer over the first nitride layer, wherein the liner layer, the first oxide layer, the first nitride layer, and the second oxide layer extend an entirety of the first distance from the first fin to the second fin;
a second nitride layer over the second oxide layer; and
a third oxide layer over the second nitride layer, wherein the liner layer, the first oxide layer, the first nitride layer, the second oxide layer, the second nitride layer, and the third oxide layer extend an entirety of the second distance from the second fin to the third fin.

10. The semiconductor device of claim 9, wherein the first oxide layer is silicon oxide, and wherein the first nitride layer is silicon oxycarbonitride.

11. The semiconductor device of claim 10, wherein the second oxide layer is silicon oxide.

12. The semiconductor device of claim 9, wherein the second nitride layer comprises a porosity being between 30% and 60%.

13. The semiconductor device of claim 9, wherein the second nitride layer is silicon oxycarbonitride, and wherein the third oxide layer is silicon oxide.

14. The semiconductor device of claim 9, wherein a first sidewall of the second fin faces and leans toward the first fin at a first angle, wherein a second sidewall of the third fin faces and leans toward the second fin at a second angle, wherein the first angle is greater than the second angle, and wherein a difference between the first angle and the second angle is greater than 0° and less than 1°.

15. A semiconductor device, comprising:
a plurality of semiconductor fins over a substrate, the plurality of semiconductor fins comprising:
a first fin couplet separated by a first distance;
a second fin couplet separated by a second distance, the second distance being greater than the first distance;
a third fin couplet separated by a third distance, the third distance being greater than the second distance; and
a fourth fin couplet separated by a fourth distance; and
a plurality of isolation regions over the substrate, the plurality of isolation regions comprising:
a first isolation region between the first fin couplet, the first isolation region comprising a first plurality of dielectric layers, the first plurality of dielectric layers comprising:
a first layer having a first U-shape within the first fin couplet and the substrate;
a second layer having a second U-shape within the first U-shape; and
a third layer filling the second U-shape;
a second isolation region between the second fin couplet, the second isolation region comprising a second plurality of dielectric layers, the second plurality of dielectric layers being greater in number than the first plurality of dielectric layers;
a third isolation region between the third fin couplet, the third isolation region comprising a third plurality of dielectric layers, the third plurality of dielectric layers being greater in number than the second plurality of dielectric layers; and
a fourth isolation region between the fourth fin couplet.

16. The semiconductor device of claim 15,
wherein the first layer comprises a first oxide layer,
wherein the second layer comprises a first nitride layer over the first oxide layer, and
wherein the third layer comprises a second oxide layer over the first nitride layer.

17. The semiconductor device of claim 16, wherein the second plurality of dielectric layers comprises:
the first oxide layer, the first oxide layer having a third U-shape within the second fin couplet and the substrate;
the first nitride layer over the first oxide layer, the first nitride layer having a fourth U-shape within the third U-shape;
the second oxide layer over the first nitride layer, the second oxide layer having a fifth U-shape within the fourth U-shape;
a second nitride layer over the second oxide layer, the second nitride layer having a sixth U-shape within the fifth U-shape; and
a third oxide layer over the second nitride layer, the third oxide layer filling the sixth U-shape.

18. The semiconductor device of claim 15, wherein the third isolation region comprises a first high-k helmet layer, and wherein the fourth isolation region comprises a second high-k helmet layer.

19. The semiconductor device of claim 18, wherein the fourth distance is greater than the third distance.

20. The semiconductor device of claim 18, wherein the first high-k helmet layer and the second high-k helmet layer comprises a metal oxide.

* * * * *